(12) United States Patent
Ohno

(10) Patent No.: US 8,748,935 B2
(45) Date of Patent: Jun. 10, 2014

(54) LIGHT-EMITTING CHIP, PRINT HEAD, AND IMAGE FORMING APPARATUS

(75) Inventor: Seiji Ohno, Kanagawa (JP)

(73) Assignee: Fuji Xerox Co., Ltd., Tokyo (JP)

(*) Notice: Subject to any disclaimer, the term of this patent is extended or adjusted under 35 U.S.C. 154(b) by 546 days.

(21) Appl. No.: 13/209,903

(22) Filed: Aug. 15, 2011

(65) Prior Publication Data

US 2012/0249712 A1    Oct. 4, 2012

(30) Foreign Application Priority Data

Mar. 28, 2011 (JP) ................. 2011-071200

(51) Int. Cl.
*H01L 31/101* (2006.01)
*B41J 2/385* (2006.01)
*B41J 2/435* (2006.01)
*B41J 2/45* (2006.01)

(52) U.S. Cl.
USPC ............ 257/115; 347/118; 347/224; 347/238

(58) Field of Classification Search
USPC ................. 257/115; 347/118, 224, 238
See application file for complete search history.

(56) References Cited

U.S. PATENT DOCUMENTS 8,494,415 B2 *    7/2013    Kii .................. 399/220

FOREIGN PATENT DOCUMENTS

JP    2001219596 A  *  8/2001
JP    A-2001-219596       8/2001

* cited by examiner

*Primary Examiner* — Sarah Al Hashimi
(74) *Attorney, Agent, or Firm* — Oliff PLC

(57) ABSTRACT

A light-emitting chip includes plural light-emitting thyristors having a first anode terminal, a first cathode terminal, and a first gate terminal, plural setting thyristors having a second anode terminal, a second cathode terminal, and a second gate terminal and setting the absolute value of a threshold voltage of each light-emitting thyristor to be smaller than that in an OFF state, plural transmission thyristors having a third anode terminal, a third cathode terminal, and a third gate terminal and setting the absolute value of a threshold voltage of each setting thyristor to be smaller than that in an OFF state, plural first connecting resistors connecting the first gate terminals and the second gate terminals, plural second connecting resistors connecting the second gate terminals and the third gate terminals, and plural third connecting resistors connecting the first gate terminals to a power supply line supplied with a source potential.

14 Claims, 13 Drawing Sheets

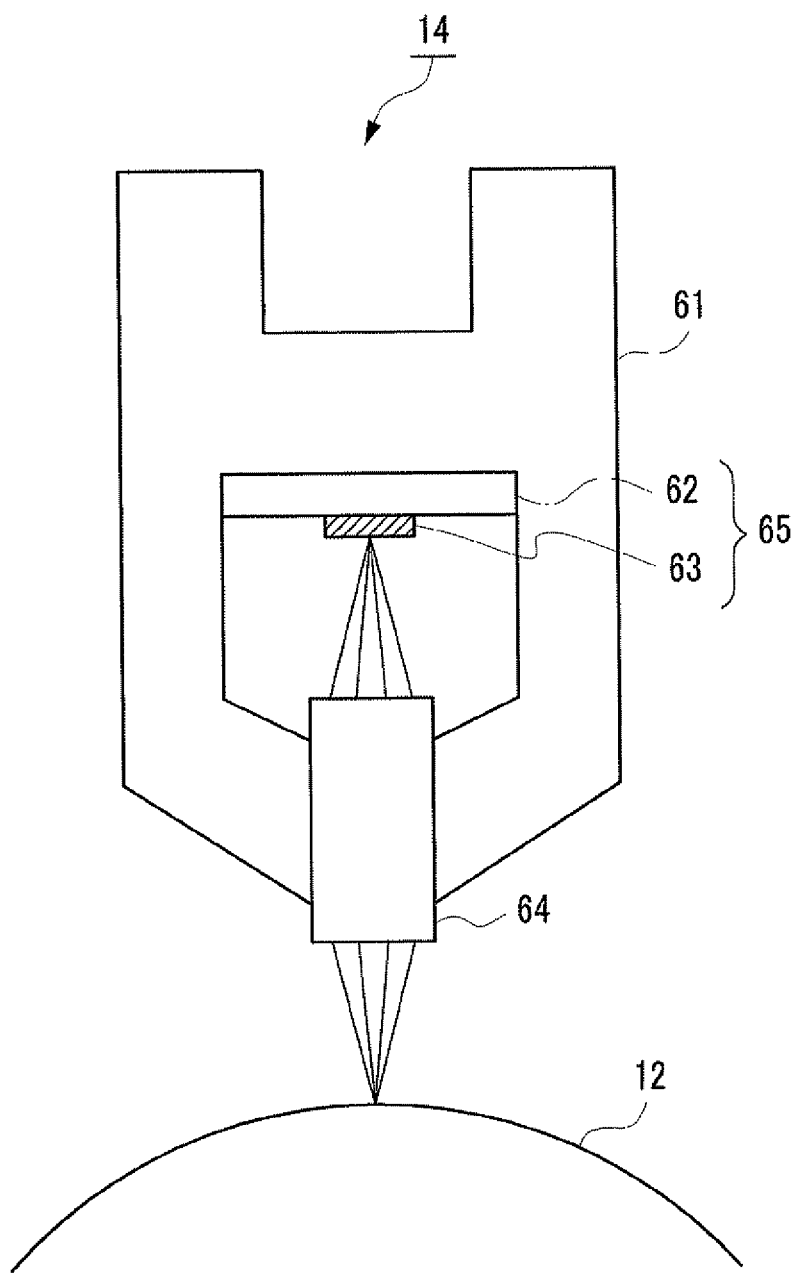

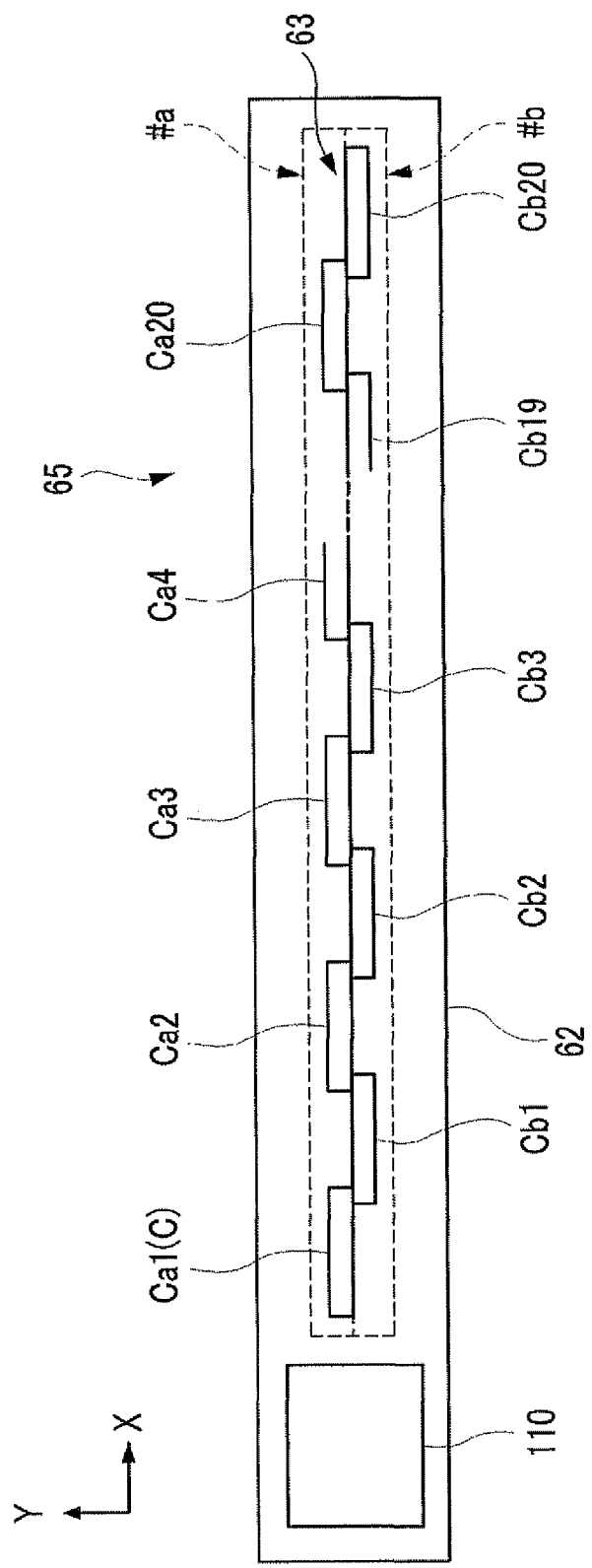

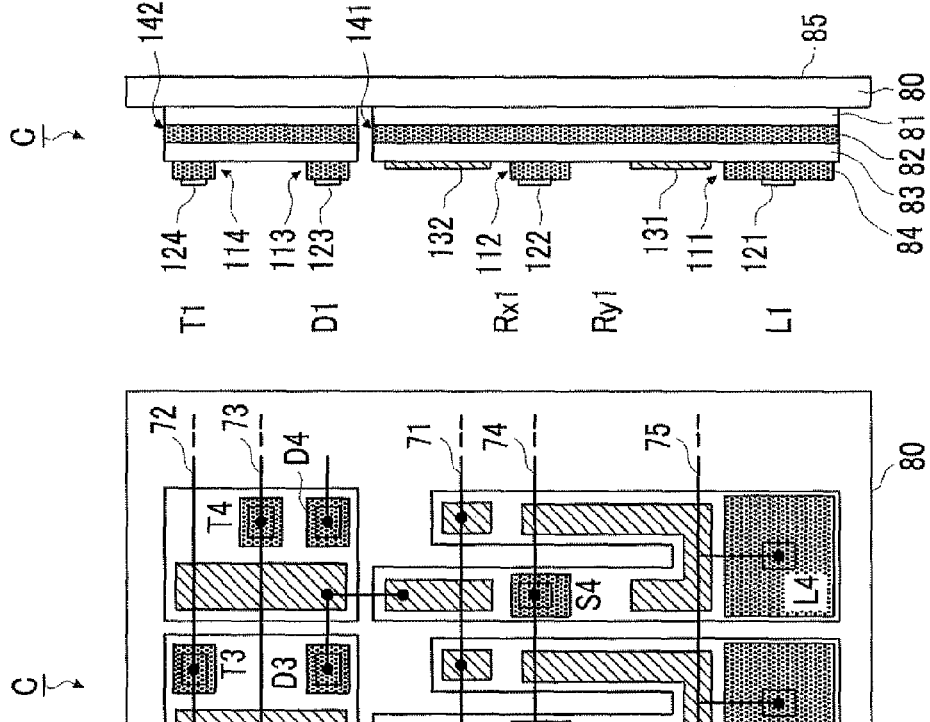
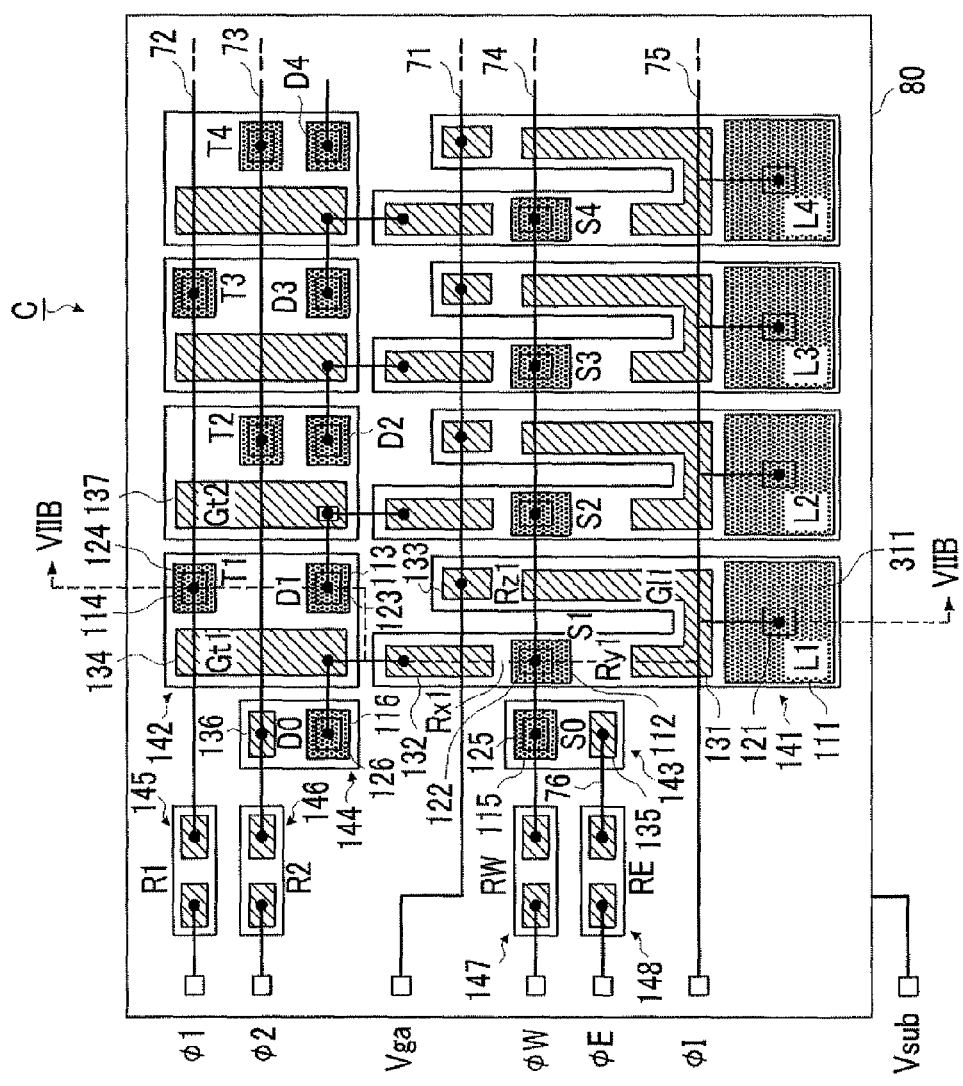

US 8,748,935 B2

LIGHT-EMITTING CHIP, PRINT HEAD, AND IMAGE FORMING APPARATUS

CROSS-REFERENCE TO RELATED APPLICATIONS

This application is based on and claims priority under 35 USC 119 from Japanese Patent Application No. 2011-071200 filed Mar. 28, 2011.

BACKGROUND (i) Technical Field

The present invention relates to a light-emitting chip, a print head, and an image forming apparatus.

(ii) Related Art

In image forming apparatuses such as a printer, a copier, and a facsimile employing an electrophotographic system, an electrostatic latent image is acquired by irradiating a uniformly-charged photosensitive member with light of image information by the use of an optical recording unit, toner is applied to the electrostatic latent image to visualize the electrostatic latent image, and the visualized image is transferred and fixed to a recording sheet of paper, whereby an image is formed. In addition to an optical scanning system using a laser as the optical recording unit and scanning an object with a laser beam in a main scanning direction to expose the object, a recording apparatus employing an LED print head (LPH) in which plural light-emitting diodes (LED) as a light-emitting element are arranged in the main scanning direction has been employed in response to recent demand for miniaturization.

SUMMARY

According to an aspect of the invention, there is provided a light-emitting chip including: plural light-emitting thyristors that are disposed on a substrate and each of which has a first anode terminal, a first cathode terminal, and a first gate terminal; plural setting thyristors that are disposed on the substrate to correspond to the plural light-emitting thyristors, each of which has a second anode terminal, a second cathode terminal, and a second gate terminal, and each of which is switched to an ON state to set the absolute value of a threshold voltage of the corresponding light-emitting thyristor to be smaller than that in an OFF state; plural transmission thyristors that are disposed on the substrate to correspond to the plural setting thyristors, each of which has a third anode terminal, a third cathode terminal, and a third gate terminal, and each of which is sequentially switched to an ON state to set the absolute value of a threshold voltage of the corresponding setting thyristor to be smaller than that in an OFF state; plural first connecting resistors that are disposed on the substrate and that connect the first gate terminals of the plural light-emitting thyristors and the second gate terminals of the plural setting thyristors to each other such that the light-emitting thyristors and the setting thyristors correspond with each other; plural second connecting resistors that are disposed on the substrate and that connect the second gate terminals of the plural setting thyristors and the third gate terminals of the plural transmission thyristors to each other such that the setting thyristors and the transmission thyristors correspond with each other; and plural third connecting resistors that are disposed on the substrate and that connect the first gate terminals of the plural light-emitting thyristors to a power supply line supplied with a source potential for supplying drive power.

BRIEF DESCRIPTION OF THE DRAWINGS

Exemplary embodiments of the present invention will be described in detail based on the following figures, wherein:

FIG. 2 is a sectional view illustrating the configuration of a print head;

FIG. 3 is a surface view of a light-emitting device according to the first exemplary embodiment;

FIG. 7A is a diagram illustrating the planar layout of the light-emitting chip according to the first exemplary embodiment and FIG. 7B is a sectional view of FIG. 7A;

DETAILED DESCRIPTION

Hereinafter, exemplary embodiments of the invention will be described in detail with reference to the accompanying drawings.

First Exemplary Embodiment

Image Forming Apparatus

Figure 1:
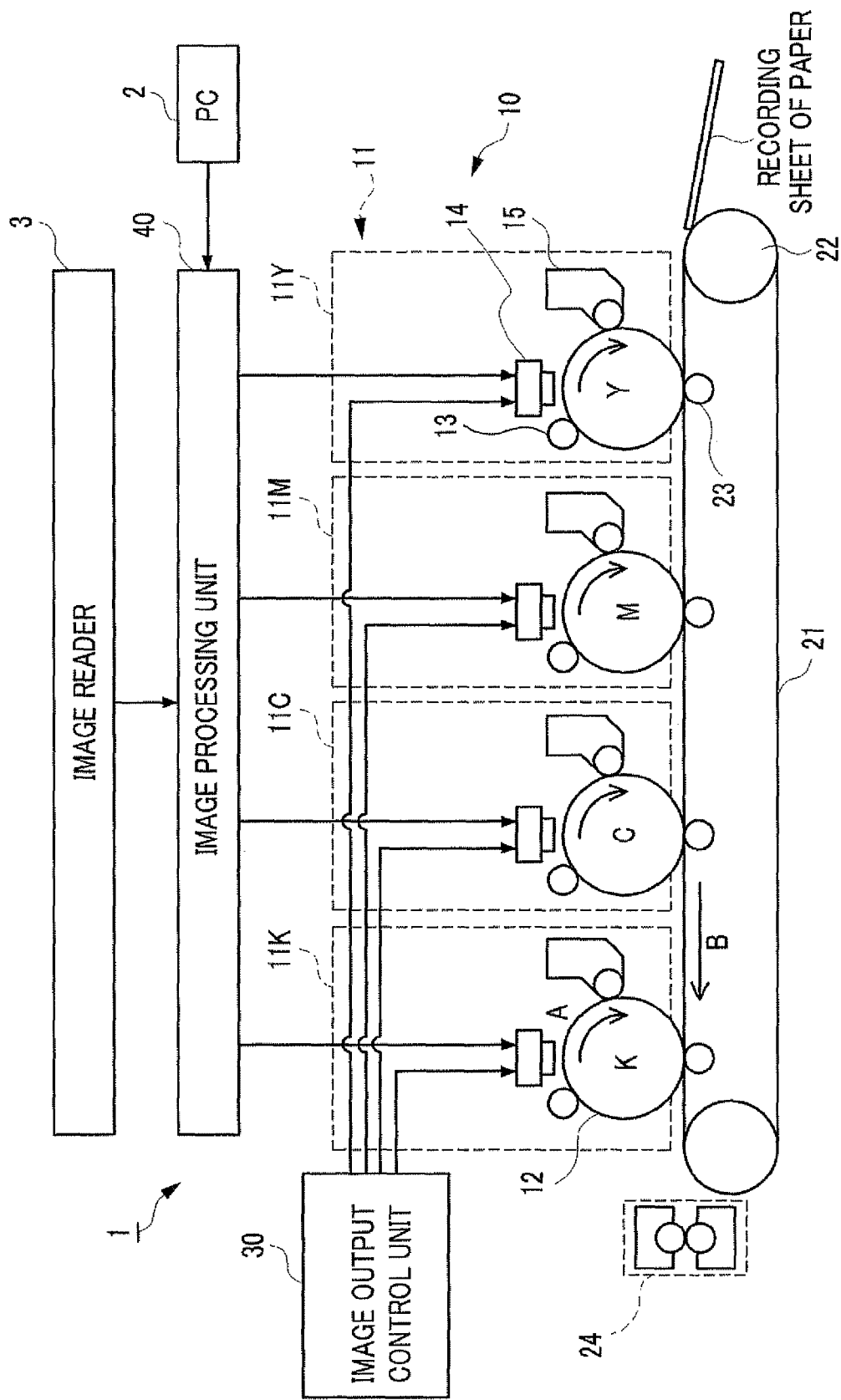
FIG. 1 is a diagram illustrating the overall configuration of an image forming apparatus according to a first exemplary embodiment of the invention.

FIG. 1 is a diagram illustrating the overall configuration of an image forming apparatus 1 according to a first exemplary embodiment of the invention. The image forming apparatus 1 shown in FIG. 1 is a so-called tandem type image forming apparatus. The image forming apparatus 1 includes an image forming process unit 10 that forms an image on the basis of image data of colors, an image output controller 30 that controls the image forming process unit 10, and an image processing unit 40 that is connected to, for example, a personal computer (PC) 2 or an image reader 3 and that performs a predetermined image process on the image data received therefrom.

The image forming process unit 10 includes an image forming unit 11 including plural engines arranged in parallel with a predetermined gap interposed therebetween. The image forming unit 11 includes four image forming units 11Y, 11M, 11C, and 11K. The image forming units 11Y, 11M, 11C, and 11K each include a photosensitive drum 12 as an example of the image-holding member that forms an electrostatic latent image thereon and that holds a toner image, a charging device 13 as an example of the charging unit that charges the surface of the photosensitive drum 12 to a predetermined potential, a print head 14 that exposes the photosensitive drum 12 charged by the charging device 13, and a developing device 15 as an example of the developing unit that develops the electrostatic latent image acquired by the print head 14. Here, the image forming units 11Y, 11M, 11C, and 11K have the same configuration, except for toner contained in the developing device 15. The image forming units 11Y, 11M, 11C, and 11K form toner images of yellow (Y), magenta (M), cyan (C), and black (K), respectively.

The image forming process unit 10 further includes a sheet carrying belt 21 that carries a recoding sheet, a driving roll 22 that drives the sheet carrying belt 21, a transfer roll 23 as an example of the transfer unit that transfers the toner images on the photosensitive drums 12 to the recording sheet of paper, and a fixing device 24 that fixes the toner images to the recording sheet of paper, so as to transfer the color toner images formed on the photosensitive drums 12 of the image forming units 11Y, 11M, 11C, and 11K to the recording sheet of paper as an example of the transferring medium in a multiplex manner.

In the image forming apparatus 1, the image forming process unit 10 performs an image forming operation on the basis of various control signals supplied from the image output controller 30. Under the control of the image output controller 30, the image data received from the personal computer (PC) 2 or the image reader 3 is processed by the image processing unit 40 and is then supplied to the image forming unit 11. For example, in the image forming unit 11K of black (K), the photosensitive drum 12 is charged to a predetermined potential by the charging device 13 while rotating in the direction of arrow A, and is then exposed by the print head 14 emitting light on the basis of the image data supplied from the image processing unit 40. Accordingly, an electrostatic latent image of a black (K) image is formed on the photosensitive drum 12. The electrostatic latent image formed on the photosensitive drum 12 is developed by the developing device 15 and the toner image of black (K) is formed on the photosensitive drum 12. The toner images of yellow (Y), magenta (M), and cyan (C) are formed by the image forming units 11Y, 11M, and 11C.

The color toner images formed on the photosensitive drums 12 by the image forming units 11 are sequentially transferred to the recording sheet of paper, which has been supplied with the movement of the sheet carrying belt 21 moving in the direction of arrow B, by a transfer electric field applied to the transfer roll 23 and a combined toner image obtained by superimposing the color toner images is formed on the recording sheet of paper.

Thereafter, the recording sheet of paper to which the combined toner image is electrostatically transferred is carried to the fixing device 24. The combined toner image on the recording sheet of paper carried to the fixing device 24 is subjected to a fixing process using heat and pressure by the fixing device 24 and is fixed to the recording sheet of paper, and the recording sheet of paper is discharged from the image forming apparatus 1.

Print Head

FIG. 2 is a sectional view illustrating the configuration of the print head 14. The print head 14 includes a housing 61, a light-emitting device 65 as an example of the exposing unit that includes a light source unit 63 having plural light-emitting elements (light-emitting thyristors in this exemplary embodiment) exposing the photosensitive drum 12, and a rod lens array 64 as an example of the optical unit that focuses light emitted from the light source unit 63 on the surface of the photosensitive drum 12.

The light-emitting device 65 includes a light source unit 63 and a circuit board 62 mounted with a signal generator circuit 110 (see FIG. 3 to be described later) driving the light source unit 63. The light-emitting device 65 may not include the signal generator circuit 110, but the image output controller 30 or the like outside the light-emitting device 65 may include the signal generator circuit 110. In this case, signals supplied from the image output controller 30 or the like to the light source unit 63 by the signal generator circuit 110 are supplied to the light-emitting device 65 via a harness or the like. In the following description, it is assumed that the light-emitting device 65 includes the signal generator circuit 110.

The housing 61 is formed of, for example, metal, supports the circuit board 62 and the rod lens array 64, and is set so as to match the light-emitting point in the light-emitting elements of the light source unit 63 with the focal plane of the rod lens array 64. The rod lens array 64 is disposed along the axis direction (which is a main scanning direction and the X direction in FIGS. 3 and 4B to be described later) of the photosensitive drum 12.

Light-Emitting Device

FIG. 3 is a surface diagram illustrating the light-emitting device 65 according to the first exemplary embodiment.

As shown in FIG. 3, in the light-emitting device 65 according to this exemplary embodiment, the light source unit 63 has a configuration in which twenty light-emitting chips Ca1~Ca20 (light-emitting group #a) and twenty light-emitting chips Cb1~Cb20 (light-emitting chip group #b) are arranged in a zigzag shape in two lines in the main scanning direction on the circuit board 62. That is, in this exemplary embodiment, two light-emitting chip groups (light-emitting chip group #a and light-emitting chip group #b) are provided. Here, the light-emitting chip group may be briefly referred to as the group. The correspondence of light-emitting chip group #a and light-emitting chip group #b will be described later in detail.

In this specification, "~" is used to represent plural elements distinguished from each other by numbers and is intended to include the elements described before and after "~" and the elements of the numbers therebetween. For example, the light-emitting chips Ca1~Ca20 include the light-emitting chips Ca1 to the light-emitting chip Ca20 in the number order.

The configurations of the light-emitting chips Ca1~Ca20 and the light-emitting chips Cb1~Cb20 may be equal to each other. Accordingly, when the light-emitting chips Ca1~Ca20 and the light-emitting chips Cb1~Cb20 are not distinguished from each other, they are referred to as the light-emitting chips C.

In this exemplary embodiment, the total number of light-emitting chips C is 40 but the invention is not limited to this number.

The light-emitting device 65 includes the signal generator circuit 110 driving the light source unit 63. As described above, the light-emitting device 65 may not include the signal generator circuit 110.

Figure 4A:
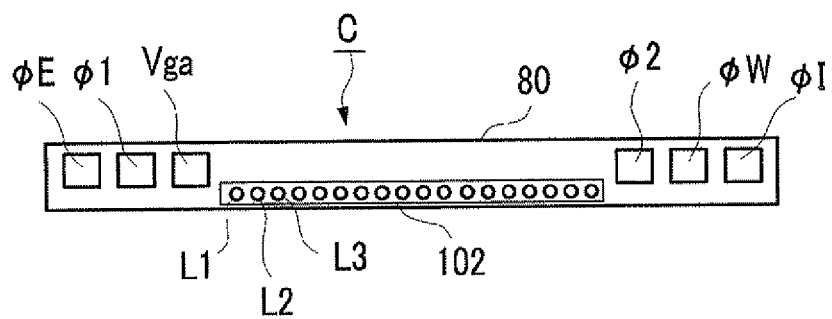
FIGS. 4A and 4B are diagrams illustrating the configuration of a light-emitting chip, the configuration of a signal generator circuit, and the wiring configuration of a circuit board according to the first exemplary embodiment.
Figure 4B:
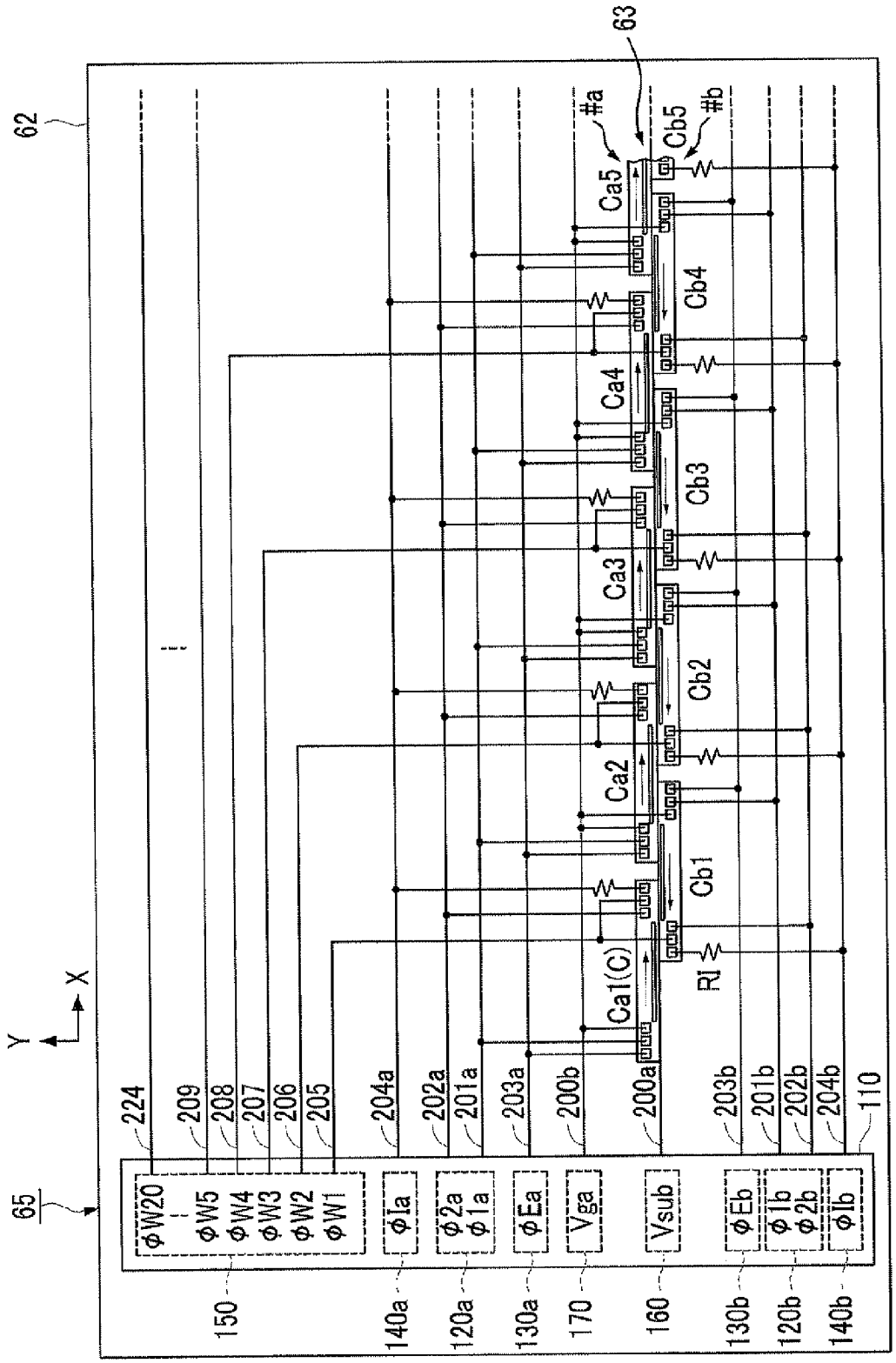

FIGS. 4A and 4B are diagrams illustrating the configuration of the light-emitting chip C, the configuration of the signal generator circuit 110, and the wiring configuration of the circuit board 62 in the first exemplary embodiment. FIG. 4A shows the configuration of the light-emitting chip C and FIG. 4B shows the configuration of the signal generator circuit 110 of the light-emitting device 65 and the wiring configuration of the circuit board 62. In this exemplary embodiment, the light-emitting chips C are classified into two light-emitting chip groups (#a and #b).

The configuration of the light-emitting chip C shown in FIG. 4A will be described below.

The light-emitting chip C includes a light-emitting section 102 including plural light-emitting elements (light-emitting thyristors L1, L2, L3, . . . in this exemplary embodiment) arranged close to a long side in a line shape along the long side on the surface of a substrate 80 having a rectangular surface shape. The light-emitting chips C includes input terminals (a φE terminal, a φ1 terminal, a Vga terminal, a φ2 terminal, a φW terminal, and a φI terminal) as plural bonding pads used to receive various control signals and the like at both ends in the long-side direction of the substrate 80. The input terminals are sequentially arranged from an end of the substrate 80 in the order of the φE terminal, the φ1 terminal, and the Vga terminal and are sequentially arranged from the other end of the substrate 80 in the order of the φI terminal, the φW terminal, and the φ2 terminal. The light-emitting section 102 is disposed between the Vga terminal and the φ2 terminal. A rear electrode 85 (see FIGS. 7A and 7B to be described later) as a Vsub terminal is disposed on the rear surface of the substrate 80. Here, the φW terminal is an example of the setting terminal and the φE terminal is an example of the enabling terminal.

The "line shape" is not limited to the state where plural light-emitting elements are arranged in a line as shown in FIG. 4A, but the light-emitting elements may be arranged with different shift lengths in the direction perpendicular to the line direction. For example, when a light-emitting surface 311 (see FIGS. 7A and 7α to be described later) of a light-emitting element is defined as a pixel, the light-emitting elements may be arranged with a shift length corresponding to several pixels or several tens pixels in the direction perpendicular to the line direction. The adjacent light-emitting elements may be arranged in a zigzag shape every other light-emitting element or every plural light-emitting elements.

The configuration of the signal generator circuit 110 of the light-emitting device 65 and the wiring configuration of the circuit board 62 will be described with reference to FIG. 4B.

As described above, the circuit board 62 of the light-emitting device 65 is mounted with the signal generator circuit 110 and the light-emitting chips C (the light-emitting chips Ca1~Ca20 and the light-emitting chips Cb1~Cb20) and is provided with wires (lines) connecting the signal generator circuit 110 and the light-emitting chips C (the light-emitting chips Ca1~Ca20 and the light-emitting chips Cb1~Cb20) to each other.

The configuration of the signal generator circuit 110 will be described below.

Although not shown, processed image data and various control signals are input to the signal generator circuit 110 from the image output controller 30 and the image processing unit 40 (see FIG. 1). The signal generator circuit 110 performs the sorting of image data, the correcting of light intensity, and the like on the basis of the image data and various control signals.

The signal generator circuit 110 includes a transmission signal generator 120*a* that transmits a first transmission signal φ1*a* and a second transmission signal φ2*a* to the light-emitting chip group #a (the light-emitting chips Ca1~Ca20) and a transmission signal generator 120*b* that transmits a first transmission signal φ1*b* and a second transmission signal φ2*b* to the light-emitting chip group #b (the light-emitting chips Cb1~Cb20) on the basis of various control signals.

The signal generator circuit 110 includes an enabling signal generator 130*a* that transmits an enabling signal φEa to the light-emitting chip group #a (the light-emitting chips Ca1~Ca20) and an enabling signal generator 130*b* that transmits an enabling signal φEb to the light-emitting chip group #b (the light-emitting chips Cb1~Cb20) on the basis of various control signals.

The signal generator circuit 110 includes a lighting signal generator 140*a* that transmits a lighting signal φIa to the light-emitting chip group #a (the light-emitting chips Ca1~Ca20) and a lighting signal generator 140*b* that transmits a lighting signal φIb to the light-emitting chip group #b (the light-emitting chips Cb1~Cb20) on the basis of various control signals.

The signal generator circuit 110 includes a setting signal generator 150 that transmits setting signals φW1~φW20 to the light-emitting chip sets, each of which includes a light-emitting chip C belonging to the light-emitting chip group #a and a light-emitting chip C belonging to the light-emitting chip group #b, on the basis of various control signals. Here, the light-emitting chip set may be briefly referred to as a set.

For example, the setting signal generator 150 transmits the setting signal φW1 to the light-emitting chip set #1 of the light-emitting chip Ca1 belonging to the light-emitting chip group #a and the light-emitting chip Cb1 belonging to the light-emitting chip group #b. The setting signal generator 150 transmits the setting signal φW2 to the light-emitting chip set #2 of the light-emitting chip Ca2 belonging to the light-emitting chip group #a and the light-emitting chip Cb2 belonging to the light-emitting chip group #b. In this way, the setting signal generator 150 transmits the setting signal φW20 to the light-emitting chip set #20 of the light-emitting chip Ca20 belonging to the light-emitting chip group #a and the light-emitting chip Cb20 belonging to the light-emitting chip group #b.

The signal generator circuit 110 includes a reference potential supply section 160 that supplies a reference potential Vsub as a reference of a potential to the light-emitting chips C (the light-emitting chips Ca1~Ca20 and the light-emitting chips Cb1~Cb20) and a source potential supply section 170 that supplies a source potential Vga for driving the light-emitting chips C (the light-emitting chips Ca1~Ca20 and the light-emitting chips Cb1~Cb20).

As described above, the transmission signal generator 120*a* and the transmission signal generator 120*b* are separated in FIGS. 4A and 4B, but they are together referred to as a transmission signal generator 120.

Similarly, the enabling signal generator 130*a* and the enabling signal generator 130*b* are separated, but they are together referred to as an enabling signal generator 130.

Similarly, the lighting signal generator 140*a* and the lighting signal generator 140*b* are separated in FIGS. 4A and 4B, but they are together referred to as a lighting signal generator 140.

Similarly, when the first transmission signal φ1*a* and the first transmission signal φ1*b* are not distinguished from each other, they are referred to as the first transmission signal φ1. When the second transmission signal φ2*a* and the second transmission signal φ2*b* are not distinguished from each other, they are referred to as the second transmission signal φ2. When the first transmission signal φ1 and the second transmission signal φ2 are not distinguished from each other, they are referred to as the transmission signal. Similarly, when the enabling signal φEa and the enabling signal φEb are not distinguished from each other, they are referred to as the enabling signal φE. When the lighting signal φIa and the lighting signal φIb are not distinguished from each other, they are referred to as the lighting signal φI. The setting signals φW1~φW20 are together referred to as the setting signal φW.

The arrangement of the light-emitting chips Ca1~Ca20 and the light-emitting chips Cb1~Cb20 will be described below.

The light-emitting chips Ca1~Ca20 belonging to the light-emitting chip group #a are arranged in a line with a predetermined interval in the long-side direction. The light-emitting chips Cb1~Cb20 belonging to the light-emitting chip group #b are similarly arranged in a line with an interval in the long-side direction. The light-emitting chips Ca1~Ca20 belonging to the light-emitting chip group #a and the light-emitting chips Cb1~Cb20 belonging to the light-emitting chip group #b are arranged in a zigzag shape in the state where they are rotated by 180° so that the long sides thereof close to the light-emitting section 102 face each other. The positions of the light-emitting chips C are set so that the light-emitting elements are parallel to each other in the main scanning direction with a predetermined gap interposed therebetween. The arrangement direction (the number order of the light-emitting thyristors L1, L2, L3, . . . in this exemplary embodiment) of the light-emitting elements of the light-emitting section 102 shown in FIG. 4A is indicated by an arrow in the light-emitting chips Ca1, Ca2, Ca3, . . . and the light-emitting chips Cb1, Cb2, Cb3, shown in FIG. 4B.

The wires (lines) connecting the signal generator circuit 110 and the light-emitting chips C (the light-emitting chips Ca1~Ca20 and the light-emitting chips Cb1~Cb20) will be described below.

The circuit board 62 includes a power supply line 200a that is connected to the terminals Vsub (see FIG. 6 and FIGS. 7A and 7B to be described later) disposed on the rear surfaces of the substrates 80 of the light-emitting chips C and that is supplied with the reference potential Vsub from the reference potential supply section 160.

The circuit board 62 includes a power supply line 200b that is connected to the Vga terminals disposed on the light-emitting chips C and that is supplied with the source potential Vga for power supply from the source potential supply section 170.

The circuit board 62 includes a first transmission signal line 201a used to transmit the first transmission signal φ1a from the transmission signal generator 120a of the signal generator circuit 110 to the φ1 terminals of the light-emitting chips Ca1~Ca20 of the light-emitting chip group #a and a second transmission signal line 202a used to transmit the second transmission signal φ2a to the φ2 terminals of the light-emitting chips Ca1~Ca20 of the light-emitting chip group #a. The first transmission signal φ1a and the second transmission signal φ2a are transmitted to the light-emitting chips Ca1~Ca20 of the light-emitting chip group #a in common (in parallel).

Similarly, the circuit board 62 includes a first transmission signal line 201b used to transmit the first transmission signal φ1b from the transmission signal generator 120b of the signal generator circuit 110 to the φ1 terminals of the light-emitting chips Cb1~Cb20 of the light-emitting chip group #b and a second transmission signal line 202b used to transmit the second transmission signal φ2b to the φ2 terminals of the light-emitting chips Cb1~Cb20 of the light-emitting chip group #b. The first transmission signal φ1b and the second transmission signal φ2b are transmitted to the light-emitting chips Cb1~Cb20 of the light-emitting chip group #b in common (in parallel).

The circuit board 62 includes an enabling signal line 203a used to transmit the enabling signal φEa to the φE terminal of the light-emitting chips Ca1~Ca20 of the light-emitting chip group #a from the enabling signal generator 130a of the signal generator circuit 110. The enabling signal φEa is transmitted to the light-emitting chips Ca1~Ca20 of the light-emitting chip group #a in common (in parallel).

Similarly, the circuit board 62 includes an enabling signal line 203b used to transmit the enabling signal φEb to the φE terminal of the light-emitting chips Cb1~Cb20 of the light-emitting chip group #b from the enabling signal generator 130b of the signal generator circuit 110. The enabling signal φEb is transmitted to the light-emitting chips Cb1~Cb20 of the light-emitting chip group #b in common (in parallel).

The circuit board 62 includes a lighting signal line 204a used to transmit, the lighting signal φIa to the φI terminal of the light-emitting chips Ca1~Ca20 of the light-emitting chip group #a from the lighting signal generator 140a of the signal generator circuit 110. The lighting signal φIa is transmitted to the light-emitting chips Ca1~Ca20 of the light-emitting chip group #a via current-limiting resistors RI disposed for every light-emitting chips Ca1~Ca20 in common (in parallel).

Similarly, the circuit board 62 includes a lighting signal line 204b used to transmit the lighting signal φIb to the φI terminal of the light-emitting chips Cb1~Cb20 of the light-emitting chip group #b from the lighting signal generator 140b of the signal generator circuit 110. The lighting signal φIb is transmitted to the light-emitting chips Cb1~Cb20 of the light-emitting chip group #b via current-limiting resistors RI disposed for every light-emitting chips Cb1~Cb20 in common (in parallel).

The current-limiting resistors RI may also be disposed in the light-emitting chips C.

The circuit board 62 includes setting signal lines 205 to 224 used to transmit the setting signals φW1~φW20 to the light-emitting chip sets, each of which includes a light-emitting chip C belonging to the light-emitting chip group #a and a light-emitting chip C belonging to the light-emitting chip group #b, from the setting signal generator 150 of the signal generator circuit 110.

For example, the setting signal line 205 is connected to the φW terminal of the light-emitting chip Ca1 belonging to the light-emitting chip group #a and the φW terminal of the light-emitting chip Cb1 belonging to the light-emitting chip group #b and transmits the setting signal φW1 to the light-emitting chip set #1 including the light-emitting chip Ca1 and the light-emitting chip Cb1. The setting signal line 206 is connected to the φW terminal of the light-emitting chip Ca2 belonging to the light-emitting chip group #a and the φW terminal of the light-emitting chip Cb2 belonging to the light-emitting chip group #b and transmits the setting signal φW2 to the light-emitting chip set #2 including the light-emitting chip Ca2 and the light-emitting chip Cb2. In this way, the setting signal line 224 is connected to the φW terminal of the light-emitting chip Ca20 belonging to the light-emitting chip group #a and the φW terminal of the light-emitting chip Cb20 belonging to the light-emitting chip group #b and transmits the setting signal φW20 to the light-emitting chip set #20 including the light-emitting chip Ca20 and the light-emitting chip Cb20.

As described above, the reference potential Vsub and the source potential Vga are transmitted to all the light-emitting chips C of the circuit board 62 in common.

The first transmission signal φ1a, the second transmission signal φ2a, the lighting signal φIa, and the enabling signal φEa are transmitted to the light-emitting chip group #a in common. The first transmission signal φ1b, the second transmission signal φ2b, the lighting signal φ1b, and the enabling signal φEb are transmitted to the light-emitting chip group #b in common.

On the other hand, the setting signals φW1~φW20 are transmitted to the light-emitting chip sets #1~#20, each of which includes a light-emitting chip C belonging to the light-emitting chip group #a and a light-emitting chip C belonging to the light-emitting chip group #b, in common.

Figure 5:
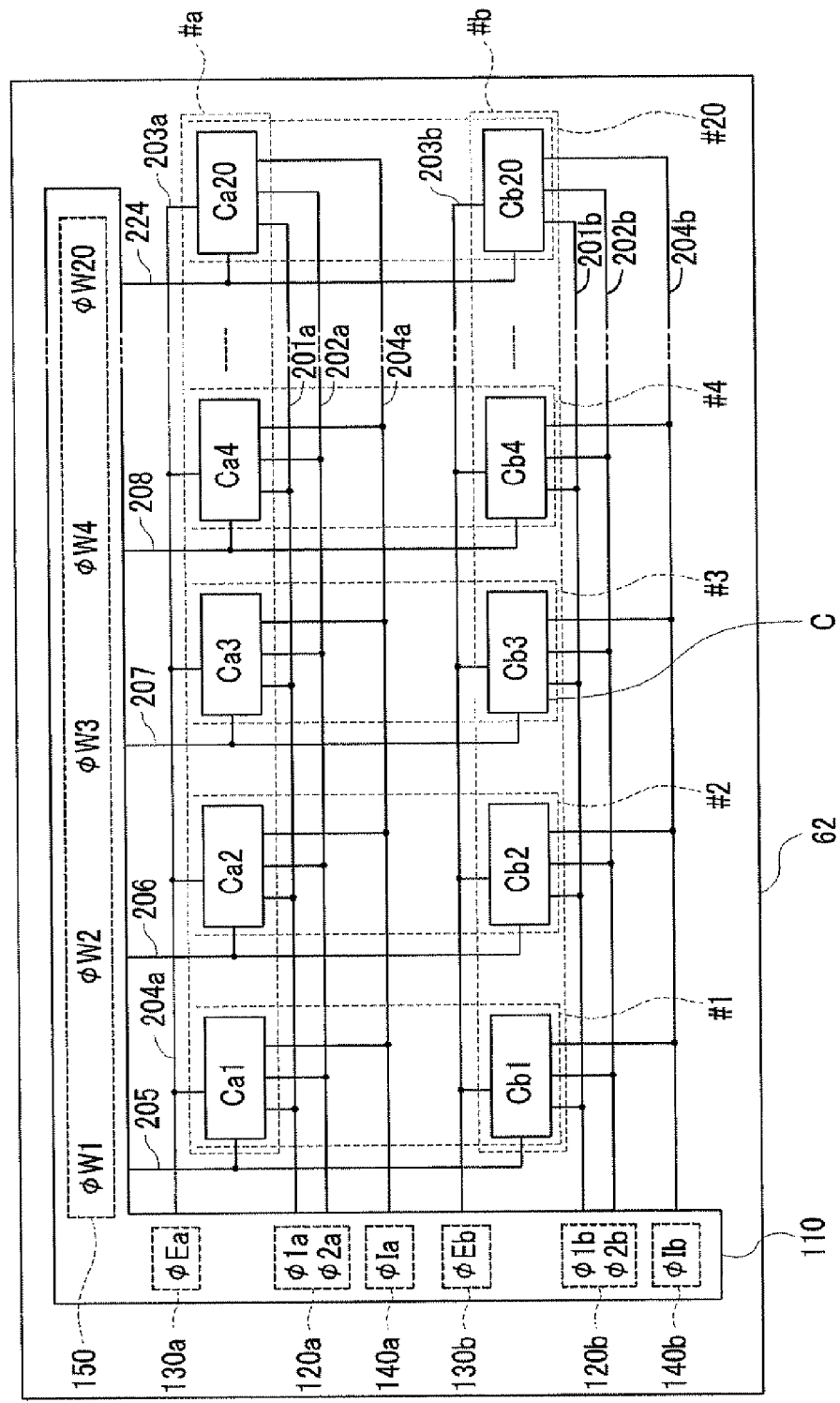
FIG. 5 is a diagram illustrating a state where the light-emitting chips of the light-emitting device according to the first exemplary embodiment are arranged as elements of a matrix.

FIG. 5 is a diagram illustrating a state where the light-emitting chips C of the light-emitting device 65 according to the first exemplary embodiment are arranged as elements of a matrix.

In FIG. 5, the light-emitting chips C (the light-emitting chips Ca1~Ca20 and the light-emitting chips Cb1~Cb20) are arranged as elements of a 2×20 matrix and only the wires (lines) of the signals (the first transmission signals φ1a and φ1b, the second transmission signals φ2a and φ2b, the lighting signals φIa and φIb, the enabling signals φEa and φEb, and the setting signals φW1~φW20) connecting the signal generator circuit 110 and the light-emitting chips C (the light-emitting chips Ca1~Ca20 and the light-emitting chips Cb1~Cb20) to each other are shown.

As described above, it can be easily understood that the first transmission signal φ1a, the second transmission signal φ2a, the lighting signal φIa, and the enabling signal φEa are transmitted to the light-emitting chip group #a in common and the first transmission signal φ1b, the second transmission signal φ2b, the lighting signal φIb, and the enabling signal φEb are transmitted to the light-emitting chip group #b in common.

On the contrary, it can be easily understood that the setting signals φW1~φW20 are transmitted to the light-emitting chip sets #1~#20, each of which includes a light-emitting chip C belonging to the light-emitting chip group #a and a light-emitting chip C belonging to the light-emitting chip group #b, in common.

Light-Emitting Chip

Figure 6:
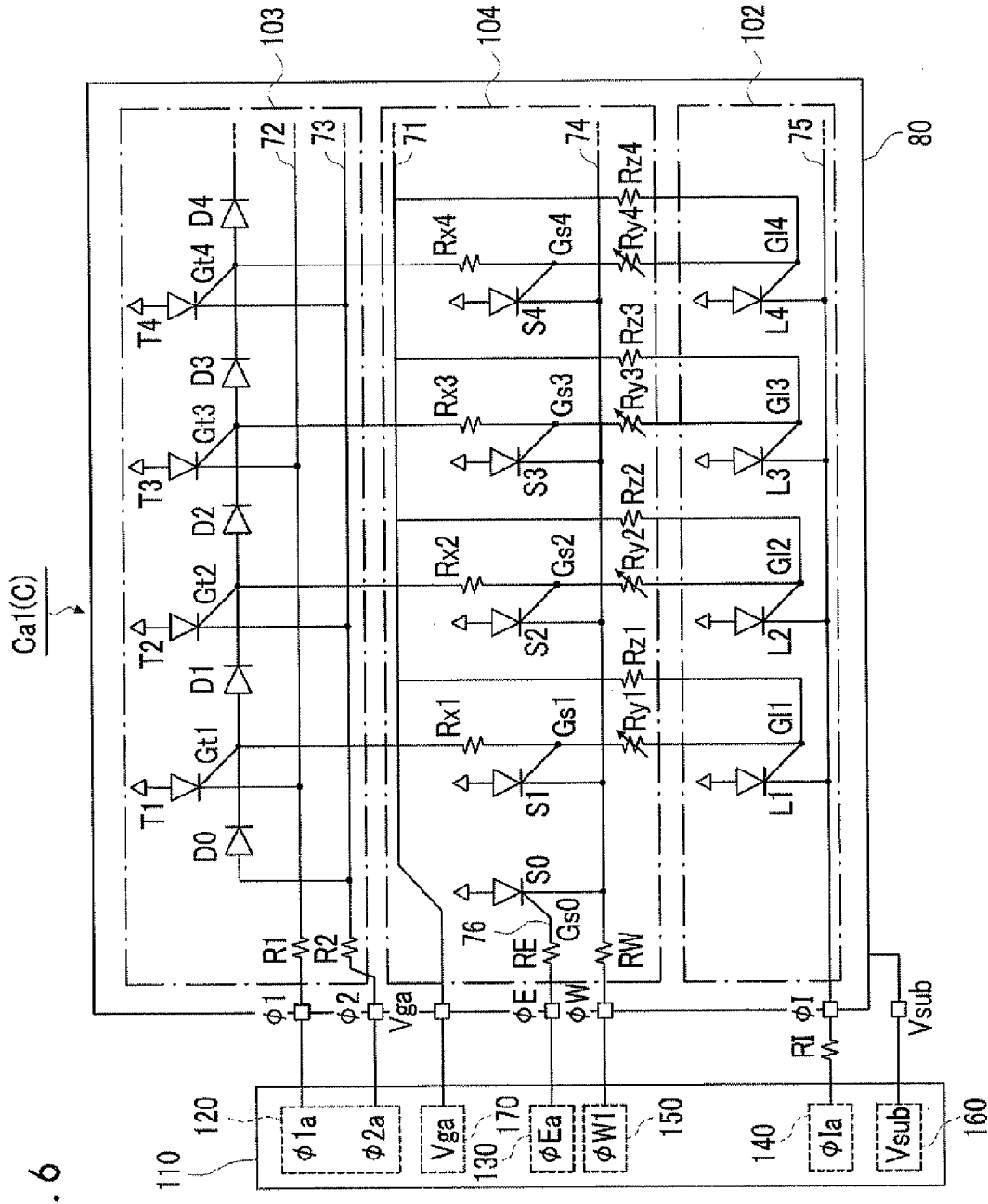
FIG. 6 is an equivalent circuit diagram illustrating the circuit configuration of the light-emitting chip which is a self-scanning light-emitting element array (SLED) chip according to the first exemplary embodiment.

FIG. 6 is an equivalent circuit diagram illustrating the circuit configuration of a light-emitting chip C which a self-scanning light-emitting element array (SLED) according to the first exemplary embodiment. In FIG. 6, the elements to be described below are arranged on the basis of the layout of the light-emitting chip C as described with reference to FIG. 7 later, except for the input terminals (the Vga terminal, the φ1 terminal, the φ2 terminal, the φE terminal, the φW terminal, and the φI terminal).

Here, the light-emitting chip Ca1 is described as an example of the light-emitting chip C. Accordingly, in FIG. 6, the light-emitting chip C is referred to as the light-emitting chip Ca1 (C). The configurations of the other light-emitting chips Ca2~Ca20 and the other light-emitting chips Cb1~Cb20 are the same as the light-emitting chip Ca1.

The input terminals (the Vga terminal, the φ1 terminal, the φ2 terminal, the φE terminal, the φW terminal, and the φI terminal) are shown at the left end in the drawing, which is not the same as shown in FIG. 4A for the purpose of easy explanation.

As described above, the light-emitting chip Ca1 (C) includes a light-emitting thyristor sequence (the light-emitting section 102 (see FIG. 4A)) including light-emitting thyristors L1, L2, L3, ... arranged in a line shape on the substrate 80.

The light-emitting chip Ca1 (C) includes a transmission thyristor sequence including transmission thyristors T1, T2, T3, ... arranged in a line shape similarly to the light-emitting thyristor sequence and a setting thyristor sequence including setting thyristors S1, S2, S3, ... arranged in a line shape similarly.

Here, when the light-emitting thyristors L1, L2, L3, ... are not distinguished from each other, they are referred to as the light-emitting thyristors L. When the transmission thyristors T1, T2, T3, ... are not distinguished from each other, they are referred to as the transmission thyristors T. When the setting thyristors S1, S2, S3, ... are not distinguished from each other, they are referred to as the setting thyristors S.

The light-emitting chip Ca1 (C) includes a setting enabling thyristor S0.

The thyristors (the light-emitting thyristors L, the transmission thyristors T, the setting thyristors S, and the setting enabling thyristor S0) are a semiconductor element having three terminals of an anode terminal, a cathode terminal, and a gate terminal.

Here, the anode terminal of each light-emitting thyristor L is referred to as a first anode terminal, the cathode terminal thereof is referred to as a first cathode terminal, and the gate terminal thereof is referred to as a first gate terminal. Similarly, the anode terminal of each setting thyristor S is referred to as a second anode terminal, the cathode terminal thereof is referred to as a second cathode terminal, and the gate terminal thereof is referred to as a second gate terminal. Similarly, the anode terminal of each transmission thyristor T is referred to as a third anode terminal, the cathode terminal thereof is referred to as a third cathode terminal, and the gate terminal thereof is referred to as a third gate terminal. Similarly, the anode terminal of the setting enabling thyristor S0 is referred to as a fourth anode terminal, the cathode terminal thereof is referred to as a fourth cathode terminal, and the gate terminal thereof is referred to as a fourth gate terminal.

The light-emitting chip Ca1 (C) includes coupling diodes D1, D2, D3, ... as an example of the electrical element between pairs, each of which includes two transmission thyristors T1, T2, T3, ... adjacent to each other in the number order. Connecting resistors Rx1, Rx2, Rx3, ... as an example of the second connecting resistor are disposed between the transmission thyristors T1, T2, T3, ... and the setting thyristors S1, S2, S3, .... Connecting resistors Ry1, Ry2, Ry3, ... as an example of the first connecting resistors are disposed between the setting thyristors S1, S2, S3, ... and the light-emitting thyristors L1, L2, L3, .... As described later in detail, the connecting resistors Ry1, Ry2, Ry3, ... have different resistance values when the setting thyristors S are in an OFF state and when the setting thyristors S are in an ON state. Accordingly, in FIG. 6, an arrow is marked in the connecting resistors Ry1, Ry2, Ry3, ... so as to represent the variable resistance values.

The light-emitting chip Ca1 (C) includes connecting resistors Rz1, Rz2, Rz3, ... as an example of the third connecting resistor.

Here, like the light-emitting thyristors L, when the coupling diodes D1, D2, D3, ... the connecting resistors Rx1, Rx2, Rx3, ..., the connecting resistors Ry1, Ry2, Ry2, ..., and the connecting resistors Rz1, Rz2, Rz3, ... are not distinguished from each other, they are referred to as the coupling diodes D, the connecting resistors Rx, the connecting resistors Ry, and the connecting resistors Rz, respectively.

The number of light-emitting thyristors L in the light-emitting thyristor sequence is set to a predetermined number. In this exemplary embodiment, when the number of light-emitting thyristors L is, for example, 128, the number of transmission thyristors T and the number of setting thyristors S each are 128. Similarly, the number of connecting resistors Rx, the number of connecting resistors Ry, and the number of connecting resistors Rz are 128. However, the number of coupling diodes D is 127 which is smaller by 1 than the number of transmission thyristors T.

Each of the number of transmission thyristors T and the number of setting thyristors S may be greater than the number of light-emitting thyristors L.

The light-emitting chip Ca1(C) includes a start diode D0, a current-limiting resistor RW, and a current-limiting resistor RE. The light-emitting chip Ca1(C) includes a current-limiting resistor R1 and a current-limiting resistor R2 for preventing excessive current from flowing in the first transmission signal line 72 used to transmit the first transmission signal φ1 and the second transmission signal line 73 used to transmit the second transmission signal φ2.

The light-emitting thyristors L1, L2, L3, ... of the light-emitting thyristor sequence, the transmission thyristors T1, T2, T3, ... of the transmission thyristor sequence, and the setting thyristors S1, S2, S3, ... of the setting thyristor sequence are arranged in the number order from the leftmost in FIG. 6. The setting enabling thyristor S0 is disposed parallel to the setting thyristor S1 outside the setting thyristor sequence.

The coupling diodes D1, D2, D3, ... the connecting resistors Rx1, Rx2, Rx3, ... the connecting resistors Ry1, Ry2, Ry3, ... and the connecting resistors Rz1, Rz2, Rz3, ... are similarly arranged in the number order from the leftmost in the drawing.

The light-emitting thyristor sequence, the transmission thyristor sequence, and the setting thyristor sequence are arranged from the uppermost in FIG. 6 in the order of the transmission thyristor sequence, the setting thyristor sequence, and the light-emitting thyristor sequence.

The transmission thyristor sequence, the coupling diodes D, the start diode D0, and the current-limiting resistors R1 and R2 constitute a shift section 103. The setting thyristor sequence, the connecting resistors Rx, the connecting resistor Ry, the connecting resistors Rz, the setting enabling thyristor S0, the current-limiting resistor RW, and the current-limiting resistor RE constitute a setting section 104. The light-emitting thyristor sequence constitutes the light-emitting section 102 as described above.

The electrical connection of the elements in the light-emitting chip Ca1(C) will be described below.

The anode terminals of the light-emitting thyristors L, the transmission thyristors T, the setting thyristors 5, and the setting enabling thyristor S0 are connected to the substrate 80 (anode common).

The anode terminals are connected to the power supply line 200a (see FIGS. 4A and 4B) via the Vsub terminal as the rear electrode 85 (see FIGS. 7A and 7B to be described later) disposed on the rear surface of the substrate 80. The power supply line 200a is supplied with the reference potential Vsub from the reference potential supply section 160.

In the arrangement of the transmission thyristors T, the cathode terminals of the odd transmission thyristors T1, T3, ... are connected to the first transmission signal line 72. The first transmission signal line 72 is connected to the φ1 terminal as the input terminal of the first transmission signal φ1a via the current-limiting resistor R1. The first transmission signal line 201a (see FIGS. 4A and 4B) is connected to the φ1 terminal and the first transmission signal φ1a is transmitted thereto.

On the other hand, in the arrangement of the transmission thyristors T, the cathode terminals of the even transmission thyristors T2, T4, ... are connected to the second transmission signal line 73. The second transmission signal line 73 is connected to the φ2 terminal as the input terminal of the second transmission signal 92a via the current-limiting resistor R2. The second transmission signal line 202a (see FIGS. 4A and 4B) is connected to the φ2 terminal and the second transmission signal φ2a is transmitted thereto.

In the light-emitting chip Cb1, the φ1 terminal is connected to the first transmission signal line 201b (see FIGS. 4A and 4B) and the first transmission signal φ1b is transmitted thereto. Similarly, the φ2 terminal is connected to the second transmission signal line 202b (see FIGS. 4A and 4B) and the second transmission signal φ2b is transmitted thereto.

The cathode terminals of the setting thyristors S and the setting enabling thyristor S0 are connected to the setting signal line 74. The setting signal line 74 is connected to the φW terminal as the input terminal of the setting signal φW1 via the current-limiting resistor RW. The φW terminal is connected to the setting signal line 205 (see FIGS. 4A and 4B) and the setting signal φW1 is transmitted thereto.

The gate terminal Gs0 of the setting enabling thyristor S0 is connected to the enabling signal line 76. The enabling signal line 76 is connected to the φE terminal as the input terminal of the enabling signal φEa via the current-limiting resistor RE. The φE terminal is connected to the enabling signal line 203a (see FIGS. 4A and 4B) and the enabling signal φEa is transmitted thereto.

The cathode terminals of the light-emitting thyristors L are connected to the lighting signal line 75. The lighting signal line 75 is connected to the φI terminal as the input terminal of the lighting signal φIa. The φI terminal is connected to the lighting signal line 204a (see FIGS. 4A and 4B) via the current-limiting resistor R1 and the lighting signal φIa is transmitted thereto.

The gate terminals Gt1, Gt2, Gt3, ... of the transmission thyristors T are connected to the gate terminals Gs1, Gs2, Gs3, ... of the setting thyristors S1, S2, S3, ... having the same numbers via the connecting resistors Rx1, Rx2, Rx3, ... in a one-to-one manner, respectively.

On the other hand, the gate terminals Gs1, Gs2, Gs3, ..., of the setting thyristors S1, S2, S3, ... are connected to the gate terminals Gl1, Gl2, Gl3, ... of the light-emitting thyristors L1, L2, L3, ... having the same numbers via the connecting resistors Ry1, Ry2, Ry3, ... in a one-to-one manner, respectively.

Here, when the gate terminals Gt1, Gt2, Gt3, ..., the gate terminal Gs1, Gs2, Gs3, ... and the gate terminals Gl1, Gl2, Gl3, ... are not distinguished from each other, they are referred to as the gate terminals Gt, the gate terminals Gs, and the gate terminals Gl, respectively.

The coupling diodes D1, D2, D3, ... are connected to pairs of gate terminals Gt, each pair of which includes two gate terminals Gt1, Gt2, Gt3, ... adjacent to each other in the number order in the transmission thyristors T1, T2, T3, .... That is, the coupling diodes D1, D2, D3, ... are connected in series so that they are sequentially interposed by the gate terminals Gt1, Gt2, Gt3, .... The direction of the coupling diode D1 is coupled in the direction in which current flows from the gate terminal Gt1 to the gate terminal Gt2. The same is true of the other coupling diodes D2, D3, D4, ....

The gate terminals Gl of the light-emitting thyristors L are connected to the power supply line 71 via the connecting resistors Rz disposed to correspond to the light-emitting thyristors L.

The gate terminal Gt1 of the transmission thyristors T1 at an end of the transmission thyristors sequence is connected to the cathode terminal of the start diode D0. On the other hand, the anode terminal of the start diode D0 is connected to the second transmission signal line 73.

FIG. 7A is a diagram illustrating a planar layout of the light-emitting chip C according to the first exemplary embodiment and 7B is a sectional view thereof. FIG. 7A shows the planar layout of the light-emitting chip C, where the light-emitting thyristors L1~L4, the setting thyristors S1~S4, and the transmission thyristors T1~T4 are mainly shown. FIG. 7B is a sectional view taken along line VIIB-VIIB of FIG. 7A. Accordingly, in the sectional view shown in FIG. 7B, the light-emitting thyristors L1, the connecting resistor Ry1 (see FIG. 8 to be described later), the connecting resistor Rx1, the coupling diode D1, and the transmission thyristors T1 are shown from the lowermost of the drawing. In FIGS. 7A and 7B, the elements and terminals are referenced using the names thereof.

In FIG. 7A, the wires connected the elements are indicated by solid lines. Through-holes opened in insulating interlayer disposed on the elements so as to connect the elements to the wires are indicated by black circles (●). In FIG. 73, the insulating interlayer and the wires are not shown.

As shown in FIG. 7B, the light-emitting chip C has a structure in which a p-type first semiconductor layer 81, an n-type second semiconductor layer 82, a p-type third semiconductor layer 83, and an n-type fourth semiconductor layer 84 are sequentially stacked on a p-type substrate 80 out of compound semiconductor such as GaAs or GaAlAs. The above-mentioned elements are disposed on plural islands (a first island 141 to an eighth island 148 and islands not referenced by any reference signs) isolated from each other by continuously etching the p-type first semiconductor layer 81, the n-type second semiconductor layer 82, the p-type third semiconductor layer 83, and the n-type fourth semiconductor layer 84.

As shown in FIG. 7A, the first island 141 has a U-shaped planar shape and includes the light-emitting thyristors L1 at the center, the setting thyristors S1 and the connecting resistors Rx1 and Ry1 in one branch, and the connecting resistor Rz1 in the other branch. The connecting resistors Rx1 and Ry1 and the connecting resistor Rz1 will be described later.

The second island 142 has a rectangular planar shape and is provided with the transmission thyristors T1 and the coupling diode D1. The third island 143 has a rectangular planar shape and is provided with the setting enabling thyristor S0. The fourth island 144 has a rectangular planar shape and includes the start diode D0.

The fifth island 145 is provided with the current-limiting resistor R1. The sixth island 146 is provided with the current-limiting resistor R2. The seventh island 147 is provided with the current-limiting resistor RW. The eighth island 148 is provided with the current-limiting resistor RE. The planar shapes of these islands are rectangular.

In the light-emitting chip C, islands (with no reference signs) like the first island 141 and the second island 142 are arranged in parallel. These islands are provided with the light-emitting thyristors L2, L3, L4, . . . , the setting thyristors S2, S3, S4, . . . , the transmission thyristors T2, T3, T4, . . . , and the like, similarly to the first island 141 and the second island 142. These will not be described.

As shown in FIG. 7B, the rear electrode 85 serving as the Vsub terminal is disposed on the rear surface of the substrate 80.

The first island 141 to the eighth island 148 will be described in detail with reference to FIGS. 7A and 7B.

The light-emitting thyristors L1 disposed at the center of the first island 141 having a U-shaped has the p-type first semiconductor layer 81 on the p-type substrate 80 as the anode terminal, has an n-type ohmic electrode 121 formed on the area 111 of the n-type fourth semiconductor layer 84 as the cathode terminal, and has a p-type ohmic electrode 131 formed on the p-type third semiconductor layer 83 exposed by removing the n-type fourth semiconductor layer 84 as the gate terminal Gl1. Light is emitted from the surface (the light-emitting surface 311) of the area 111 of the n-type fourth semiconductor layer 84 other than the area covered with the n-type ohmic electrode 121 and the lighting signal line 75. The p-type ohmic electrode 131 is disposed close to the area 111 and extends to both branches of the U shape of the first island 141.

The setting thyristors S1 disposed in one branch of the U shape of the first island 141 has the p-type first semiconductor layer 81 on the p-type substrate 80 as the anode terminal, has the n-type ohmic electrode 122 formed on the area 112 of the n-type fourth semiconductor layer 84 as the cathode terminal, and has the p-type third semiconductor layer 83 as the gate terminal Gs1. The p-type third semiconductor layer 83 serves as the gate layer. The gate terminal Gs1 is not an independent electrode but continuously extends from the p-type third semiconductor layer 83 (layer serving as a resistor) of the connecting resistor Rx and the connecting resistor Ry to be described later.

Figure 8:
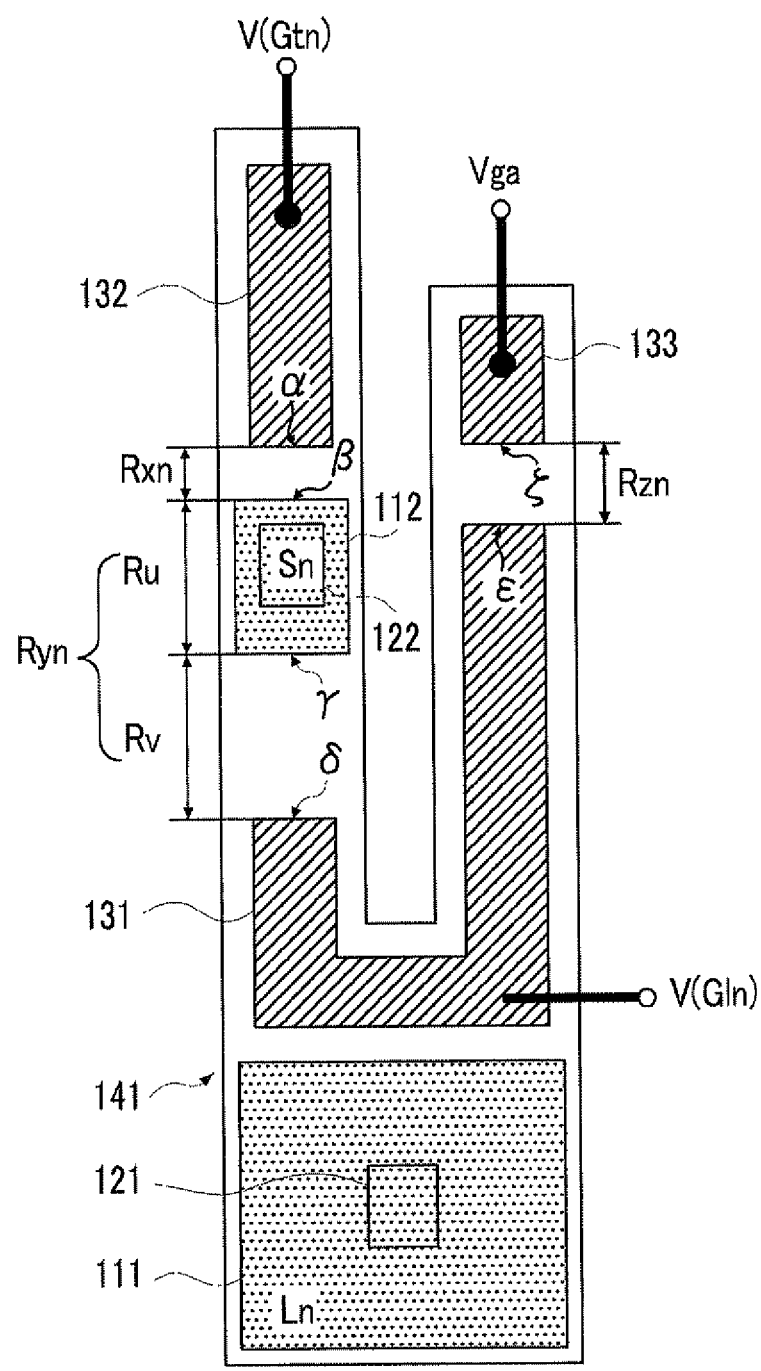
FIG. 8 is an enlarged plan view illustrating a first island in the light-emitting chip according to the first exemplary embodiment.

Similarly, the connecting resistor Rx1 disposed in the first island 141 has the p-type third semiconductor layer 83 between the p-type ohmic electrode 132 disposed on the p-type third semiconductor layer 83 and the setting thyristors S1 as the resistor. The p-type ohmic electrode 132 is disposed at an end of one branch of the U shape of the first island 141. As shown in FIG. 8, the connecting resistor Ry1 includes a part (Ru) having the gate layer of the setting thyristors S1 as a resistor and a part (Rv) having the p-type third semiconductor layer 83 between the setting thyristors S1 and the p-type ohmic electrode 131 (the gate terminal Gl1) as a resistor.

The connecting resistor Rz1 disposed in the first island 141 has the p-type third semiconductor layer 83 between the p-type ohmic electrode 131 (the gate terminal Gl1) disposed on the p-type third semiconductor layer 83 and the p-type ohmic electrode 133 disposed on the p-type third semiconductor layer 83 as a resistor. The p-type ohmic electrode 133 is disposed at an end of the other branch of the U shape of the first island 141.

The coupling diode D1 disposed in the second island 142 has the n-type ohmic electrode 123 disposed on the are 113 of the n-type fourth semiconductor layer 84 as a cathode terminal and has the p-type ohmic electrode 134 disposed on the p-type third semiconductor layer 83 exposed by removing the n-type fourth semiconductor layer 84 as an anode terminal.

Similarly, the transmission thyristors T1 disposed in the second island 142 has the p-type fourth semiconductor layer 84 on the p-type substrate 80 as an anode terminal, has the n-type ohmic electrode 124 formed in the area 114 of the n-type fourth semiconductor layer 84 as a cathode terminal, and has the p-type ohmic electrode 134 as a gate terminal Gt1.

The same is true of the islands arranged in parallel to the first island 141 and the second island 142.

The setting enabling thyristor S0 disposed in the third island 143 has the p-type fourth semiconductor layer 84 on the p-type substrate 80 as an anode terminal, has the n-type ohmic electrode 125 formed in the area 115 of the n-type fourth semiconductor layer 84 as a cathode terminal, and has the p-type ohmic electrode 135 formed on the p-type third semiconductor layer 83 exposed by removing the n-type fourth semiconductor layer 84 as a gate terminal Gs0.

The start diode D0 disposed in the fourth island 144 has the n-type ohmic electrode 126 disposed in the area 116 of the n-type fourth semiconductor layer 84 as a cathode terminal and the p-type ohmic electrode 136 formed on the p-type third semiconductor layer 83 exposed by removing the n-type fourth semiconductor layer 84 as an anode terminal.

The current-limiting resistor R1 disposed in the fifth island 145, the current-limiting resistor R2 disposed in the sixth island 146, the current-limiting resistor RW disposed in the seventh island 147, and the current-limiting resistor RE disposed in the eighth island 148 have the p-type third semiconductor layer 83 between a set of p-type ohmic electrodes (without any reference sign) formed on the p-type third semiconductor layer 83 as a resistor.

The connections of the elements will be described with reference to FIG. 7A.

The n-type ohmic electrode 121 as the cathode terminal of the light-emitting thyristors L1 in the first island 141 is connected to the lighting signal line 75. The lighting signal line 75 is connected to the φI terminal. Although not described, the same is true of the light-emitting thyristors L2, L3, L4, . . . .

The n-type ohmic electrode 122 as the cathode terminal of the setting thyristor S1 in the first island 141 is connected to the setting signal line 74. Although not described, the same is true of the setting thyristors S2, S3, S4, . . . . The n-type ohmic electrode 125 as the cathode terminal of the setting enabling thyristor S0 in the third island 143 is also connected to the setting signal line 74. The setting signal line 74 is connected to the φW terminal via the current-limiting resistor RW disposed in the seventh island 147.

The p-type ohmic electrode 132 in the first island 141 is connected to the p-type ohmic electrode 134 (the gate terminal Gt1) of the second island 142.

The p-type ohmic electrode 133 in the first island 141 is connected to the power supply line 71. The same is true of the islands similar to the first island 141 and arranged in parallel to the first island 141. The power supply line 71 is connected to the Vga terminal.

The p-type ohmic electrode 134 (the gate terminal Gt1) in the second island 142 is connected to the n-type ohmic electrode 126 as the cathode terminal of the start diode D0 disposed in the third island 143.

The n-type ohmic electrode 124 as the cathode terminal of the transmission thyristors T1 disposed in the second island 142 is connected to the first transmission signal line 72. The first transmission signal line 72 is connected to the φ1 terminal via the current-limiting resistor R1 disposed in the fifth island 145. The same is true of the odd transmission thyristors T3, T5, . . . disposed in the islands similar to the second island 142 and arranged in parallel to the second island 142.

The cathode terminals of the even transmission thyristors T2, T4, T6, . . . disposed in the islands similar to the second island 142 and arranged in parallel to the second island 142 are connected to the second transmission signal line 73. The p-type ohmic electrode 136 as the anode terminal of the start diode D0 disposed in the fourth island 144 is also connected to the second transmission signal line 73. The second transmission signal line 73 is connected to the φ2 terminal via the current-limiting resistor R2 disposed in the sixth island 146.

The cathode terminal of the coupling diode D1 disposed in the second island 142 is connected to the p-type ohmic electrode 137 as the gate terminal Gt2 of the transmission thyristors T2 disposed in the island adjacent and similar to the second island 142. The same is true of the islands similar to the second island 142 and arranged in parallel to the second island 142.

The p-type ohmic electrode 135 as the anode terminal of the setting enabling thyristor S0 disposed in the fifth island 145 is connected to the enabling signal line 76. The enabling signal line 76 is connected to the φE terminal via the current-limiting resistor RE disposed in the eighth island 148.

The fundamental operation (basic operation) of the thyristors (the light-emitting thyristors L, the transmission thyristors T, the setting thyristors S, and the setting enabling thyristor S0) and the threshold voltages of the setting thyristors S and the light-emitting thyristors L will be described below.

Basic Operation of Thyristors

A thyristor is a semiconductor element having three terminals of an anode terminal, a cathode terminal, and a gate terminal.

For example, as shown in FIG. 6 and FIGS. 7A and 7B, it is assumed that the reference potential Vsub supplied to the Vsub terminal (the anode terminal of the thyristors) of the light-emitting chip C is 0 V as a high-level potential (hereinafter, referred to as "H") and the source potential Vga supplied to the Vga terminal is −3.3 V as a low-level potential (hereinafter, referred to as "L"). As shown in FIG. 7B, it is assumed that the thyristor has a structure in which a p-type semiconductor layer (the first semiconductor layer 81 and the third semiconductor layer 83) and the n-type semiconductor layer (the second semiconductor layer 82 and the fourth semiconductor layer 84) are stacked out of GaAs, GaAlAs, or the like and a pn-junction diffusion potential (forward potential) Vd is 1.5 V.

In a thyristor in the OFF state, the current flowing between the anode terminal and the cathode terminal is smaller than that in the ON state. When a potential (a negative potential having an absolute value higher) lower than the threshold voltage is applied to the cathode terminal, the thyristor in the OFF state is switched to the ON state (turned on). When the thyristor is turned on, the thyristor is in the state (the ON state) where the current larger than that in the OFF state flows between the anode terminal and the cathode terminal. Here, the threshold voltage of the thyristor is obtained by subtracting the diffusion potential Vd from the potential of the gate terminal. Accordingly, when the potential of the gate terminal of the thyristor is −1.5 V, the threshold value is −3.0 V. That is, when a potential lower than −3.0 V is applied to the cathode terminal, the thyristor is turned on. When the potential of the gate terminal of the thyristor is 0 V, the threshold voltage is −1.5 V.

The gate terminal of the thyristor in the ON state has a potential close to the potential of the anode terminal of the thyristors. Here, since the potential of the anode terminal is set to 0 V ("H"), it is assumed that the potential of the gate terminal is 0 V ("H"). The potential of the cathode terminal of the thyristor in the ON state is obtained by subtracting the pn-junction diffusion potential Vd from the potential of the anode terminal. That is, the potential of the cathode terminal is −1.5 V.

When the thyristor is once turned on, the thyristor is maintained in the ON state until the potential of the cathode terminal reaches the potential (a negative potential having a small absolute value, 0, or a positive potential) higher than the potential (the maintenance potential) necessary for maintaining the ON state. The potential of the cathode terminal of the thyristor in the ON state is −1.5 V. Accordingly, when a potential lower than −1.5 V is continuously applied to the cathode terminal and the current for maintaining the ON state is supplied, the thyristor is maintained in the ON state. The maintenance potential is −Vd (−1.5 V).

On the other hand, when a potential higher than −1.5 V is applied to the cathode terminal, the thyristor is switched to the OFF state (turned off). For example, when the potential of the cathode terminal is switched to "H" (0 V), the cathode terminal and the anode terminal have the same potential and thus the thyristor is turned off.

The thyristor in the ON state is maintained in the state where the current flows and is not switched to the OFF state by the potential of the gate terminal. That is, the thyristor has a function of maintaining (memorizing, holding) the ON state.

As described above, the potential applied to the cathode terminal to maintain the ON state of the thyristors turns on the thyristors and thus may be lower than the potential applied to the cathode terminal.

The light-emitting thyristor L lights (emits light) when it is turned on and is extinguished (does not emit light) when it is turned off. The emission intensity (brightness) of the light-emitting thyristor L in the ON state can be determined depending on the current flowing between the cathode terminal and the anode terminal. The transmission thyristors T, the setting thyristors S, and the setting enabling thyristor S0 may emit light when they are turned on. When the light intensity is great, it has an influence on the formation of an image, thereby suppressing the light intensity by the blocking of light or the like.

Threshold Voltages of Setting Thyristors S and Light-Emitting Thyristors L

The threshold voltages of the setting thyristors S and the light-emitting thyristors L will be described below.

FIG. 8 is an enlarged plan view of the first island 141.

Here, the transmission thyristor Tn, the setting thyristor Sn, and the light-emitting thyristor Ln which have number n will be described as an example. The reference numerals and signs of the island, the area, the p-type ohmic electrode, and the n-type ohmic electrode are the same as the first island 141 shown in FIGS. 7A and 7B.

Here, it is also assumed that the reference potential Vsub supplied to the Vsub terminal of the light-emitting chip C is 0 V ("H") and the source potential Vga supplied to the Vga terminal is −3.3 V ("L").

The connecting resistor Rx has the p-type third semiconductor layer 83 between the edge (α) indicated by α in the p-type ohmic electrode 132 and the edge (β) indicted by β in the setting thyristor S1 as a resistor. The connecting resistor Ry includes a resistor Ru having the p-type third semiconductor layer 83 (between β and γ to be described later) of the setting thyristor S1 as a resistor and the resistor Rv having the p-type third semiconductor layer 83 between the other edge (γ) indicated by γ in the setting thyristor Sn and one edge (δ) indicated by δ in the p-type ohmic electrode 131 (the gate terminal G1n) as a resistor.

The connecting resistor Rz has the p-type third semiconductor layer 83 between the other edge (δ) indicated by ϵ in the p-type ohmic electrode 133 and the other edge (ζ) indicated by ζ in the p-type ohmic electrode 131 as a resistor.

When the potential of the gate terminal Gtn is V(Gtn), the potential of the gate terminal Gln is V(Gln), and the source potential Vga is Vga, the potentials of V(α), v(β), V(γ), V(δ), V(ϵ), and V(ζ) of α, β, γ, δ, ϵ, and ζ are as follows. Ry=Ru+Rv is established.

Expressions 1 to 5

$$V(\alpha) = V(Gtn) \quad (1)$$

$$V(\beta) = V(Gtn) + (Vga - V(Gtn)) \times \frac{Rx}{Rx + Ru + Rv + Rz)} \quad (2)$$

$$V(\gamma) = V(Gtn) + (Vga - V(Gtn)) \times \frac{Rx + Ru}{Rx + Ru + Rv + Rz} \quad (3)$$

-continued $$V(\delta) = V(\varepsilon) = V(Gln) \quad (4)$$
$$= V(Gtn) + (Vga - V(Gtn)) \times \frac{Rx + Ru + Rv}{Rx + Ru + Rv + Rz}$$

$$V(\xi) = Vga \quad (5)$$

When the transmission thyristor Tn is in the ON state, the setting thyristor Sn is turned on and the light-emitting thyristor Ln is turned on to light (emit light).

Here, it is considered that the transmission thyristor Tn is in the ON state. When the transmission thyristor Tn is in the ON state, V(Gtn) is 0 V.

The setting thyristor Sn is turned on by causing current to flow from the part having the highest potential to the p-type third semiconductor layer 83 (the gate layer) just below the n-type fourth semiconductor layer 84 (the cathode layer) in the area 112. The ON state is spread to the periphery and the overall setting thyristor Sn is switched to the ON state.

Since the part having the highest potential in the setting thyristor Sn is the edge of the setting thyristor Sri indicated by β in FIG. 8, the threshold voltage of the setting thyristor Sn is (V(β)−Vd). Vd is the potential (1.5 V in this case) of the pn-junction diffusion potential Vd.

On the other hand, the threshold value of the light-emitting thyristor Ln is (V(δ)−Vd).

As described later, the light-emitting thyristor Ln should not be turned on until the setting thyristor Sn is turned on. Accordingly, comparing the threshold voltage (the absolute value) of the light-emitting thyristor Ln with the threshold voltage (the absolute value) of the setting thyristor Sn, it is preferable that the threshold voltage (the absolute value) of the setting thyristor Sn is as low as possible and the threshold voltage (the absolute value) of the light-emitting thyristor Ln is as high as possible.

Accordingly, can be seen from Expressions 2 and 4, it is effective that the ratio of (Ru+Rv) to (Rx+Ru+Rv+Rz) is great.

When the setting thyristor Sn is turned on, even the edge (γ) of the setting thyristor Sn shown in FIG. 8 becomes 0 V. The resistance value of the resistor Rv between the edge (γ) and the edge (δ) decreases from several tens percentage to several percentage due to a variation in conductivity (conductivity modulation). Accordingly, the potential VGln (V(δ)) of the gate terminal Gln is almost 0 V. Therefore, the threshold voltage of the light-emitting thyristor L is close to −Vd.

The threshold voltages of the setting thyristor Sn and the light-emitting thyristor Ln will be described below in more detail.

For example, Rx=2 kΩ, Ru=8 kΩ, Rv=8 kΩ, and Rz=6 kΩ are assumed. The source potential Vga is −3.3 V and the diffusion potential Vd is 1.5 V.

The potential V(Gtn) of the gate terminal Gtn is 0 V when the transmission thyristor Tn of number n is in the ON state. As described later, V(Gtn) is −1.5 V when the transmission thyristor Tn−1 of number (n−1) is in the ON state, and is −3.0 V when the transmission thyristor Tn−2 of number (n−2) is in the ON state.

First, when V(Gtn) is 0 V, the threshold voltage of the setting thyristor Sn expressed by (V(β)−Vd) is −1.78 V. On the other hand, the threshold voltage of the light-emitting thyristor Ln expressed by (V(δ)−Vd) is −3.98 V. The difference therebetween is 2.2 V.

When the setting thyristor Sn is turned on, V(γ) is 0 V. As described above, the resistance value of the resistor Rv decreases due to the variation in conductivity (conductivity modulation). Here, it is assumed that the resistor Rv (8 kΩ) is modulated to the resistor Rv' (0.8 kΩ) of which the resistance value is 1/10. Then, the potential V'(Gln) of the gate terminal Gin when the setting thyristor Sn is in the ON state is as follows.

$$V'(Gtn)=V'(\delta)=V'(\epsilon)=V(\gamma)+(Vga-V(\gamma))\times Rv'/Rv'-Rz)$$ Expression 6

Since the setting thyristor Sn is turned on, V(γ) is 0 V. Accordingly, V'(Gtn) is −0.39 V. The threshold voltage of the light-emitting thyristor Ln is −1.89 V close to −Vd.

When V(Gtn) is −1.5 V, the threshold voltage of the setting thyristor Sn is −3.15 V by the same calculation as described above. On the other hand, the threshold voltage of the light-emitting thyristor Ln is −4.35 V.

When V(Gtn) is −3.0 V, the threshold voltage of the setting thyristor Sn is −4.53 V. On the other hand, the threshold voltage of the light-emitting thyristor Ln is −4.73 V.

Operation of Light-Emitting Device

The operation of the light-emitting device 65 will be described below.

The light-emitting device 65 includes the light-emitting chips Ca1~Ca20 belonging to the light-emitting chip group #a and the light-emitting chips Cb1~Cb20 belonging to the light-emitting chip group #b (see FIGS. 3, 4A, 4B, and 5).

As shown in FIGS. 4A and 4B, all the light-emitting chips C (the light-emitting chips Ca1~Ca20 and the light-emitting chips Cb1~Cb20) on the circuit board 62 are supplied with the reference potential Vsub and the source potential Vga in common.

As described above, the first transmission signal φ1a, the second transmission signal φ2a, the lighting signal φIa, and the enabling signal φEa are transmitted to the light-emitting chips Ca1~Ca20 of the light-emitting chip group #a in common. Accordingly, the light-emitting chips Ca1~Ca20 of the light-emitting chip group #a are driven in parallel.

Similarly, as described above, the first transmission signal φ1b, the second transmission signal φ2b, the lighting signal φIb, and the enabling signal φEb are transmitted to the light-emitting chips Cb1~Cb20 of the light-emitting chip group #b in common. Accordingly, the light-emitting chips Cb1~Cb20 of the light-emitting chip group #b are driven in parallel.

On the other hand, the setting signals φW1~φW20 are transmitted to the light-emitting chip sets #1~#20 each of which includes a light-emitting chip C of the light-emitting chip group #a and a light-emitting chip C of the light-emitting chip group #b. For example, the setting signal φW1 is transmitted to the light-emitting chip set #1 including the light-emitting chip Ca1 of the light-emitting chip group #a and the light-emitting chip Cb1 of the light-emitting chip group #b in common. The twenty setting signals φW1~φW20 are transmitted in parallel at the same time. Accordingly, the light-emitting chip sets #1~#20 are driven in parallel.

As described later, the setting signals φW1~φW20 may be transmitted with a time delay so as to correct the light intensity of the light-emitting thyristors L.

Since the light-emitting chips Ca2~Ca20 of the light-emitting chip group #a are driven in parallel with the light-emitting chip Ca1 and the light-emitting chips Cb2~Cb20 of the light-emitting chip group #b are driven in parallel with the light-emitting chip Cb1, only the operation of the light-emitting chips Ca1 and Cb1 belonging to the light-emitting chip set #1 will be described. Similarly, since the light-emitting chip sets #2~#20 are driven in parallel with the light-emitting chip set #1, only the light-emitting chip set #1 to which the light-emitting chips Ca1 and Cb1 belong will be described.

Figure 9:
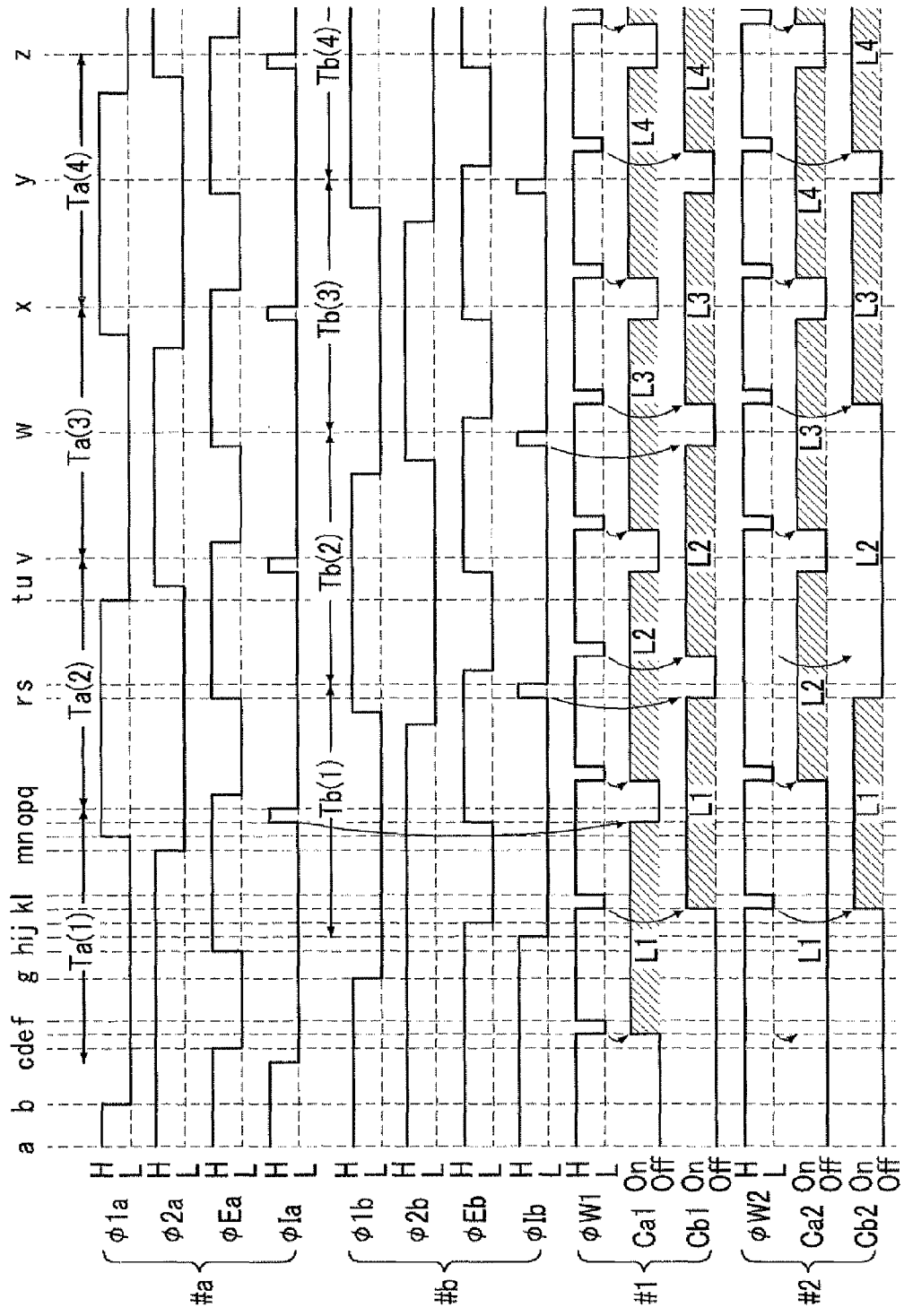
FIG. 9 is a timing diagram illustrating the operations of the light-emitting device and the light-emitting chip according to the first exemplary embodiment.

FIG. 9 is a timing diagram illustrating the operation of the light-emitting device and the light-emitting chips C in the first exemplary embodiment.

In FIG. 9, the operation of the light-emitting chip set #2 (the light-emitting chips Ca2 and Cb2) is illustrated in addition to the operation of the light-emitting chip set #1 (the light-emitting chips Ca1 and Cb1). In FIG. 9, parts of each light-emitting chip C controlling the lighting or non-lighting of four light-emitting thyristors L of the light-emitting thyristors L1~L4 are shown. The control of the lighting or non-lighting of the light-emitting thyristors L is referred to as lighting control.

In the light-emitting chip set #1 (the light-emitting chips Ca1 and Cb1), the light-emitting thyristors L1~L4 are all made to light. In the light-emitting chip set #2 (the light-emitting chips Ca2 and Cb2), the light-emitting thyristors L2, L3, and L4 of the light-emitting chip Ca2 are made to light and the light-emitting thyristors L1, L3, and L4 of the light-emitting chip Cb2 are made to light. The light-emitting thyristor L1 of the light-emitting chip Ca2 and the light-emitting thyristor L2 of the light-emitting chip Cb2 are not made to light (non-lighting).

The operation of the light-emitting chips Ca1 and Cb1 will be described below.

In FIG. 9, it is assumed that time passes from time a to time z in the alphabet order. In the light-emitting chip Ca1 of the light-emitting chip group #a, the light-emitting thyristor L1 is controlled to light in the period Ta(1) from time c to time p. The light-emitting thyristor L2 is controlled to light in the period Ta(2) from time p to time v. The light-emitting thyristor L3 is controlled to light in the period Ta(3) from time v to time x. The light-emitting thyristor L4 is controlled to light in the period Ta(4) from time x to time z. The light-emitting thyristors L of which the number is 5 or more are controlled to light in the same way.

On the other hand, in the light-emitting chip Cb1 of the light-emitting chip group #b, the light-emitting thyristor L1 is controlled to light in the period Tb(1) from time i to time s. The light-emitting thyristor L2 is controlled to light in the period Tb(2) from time s to time w. The light-emitting thyristor L3 is controlled to light in the period Tb(3) from time w to time y. The light-emitting thyristors L of which the number is 4 or more are controlled to light in the same way.

In this exemplary embodiment, the periods Ta(1), Ta(2), Ta(3), . . . and the periods Tb(1), Tb(2), Tb(3), . . . have the same length and are referred to as period T when they are not distinguished from each other.

It is assumed that the periods Ta(1), Ta(2), Ta(3), . . . in which the light-emitting chips Ca1~Ca20 of the light-emitting chip group #a are controlled and the periods Tb(1), Tb(2), Tb(3), . . . in which the light-emitting chips Cb1~Cb20 of the light-emitting chip group #b are controlled are different by a half length of the period T (by 180° in terms of phase). That is, the period Tb(1) is started when the half of the period T passes after the period Ta(1) is started.

Accordingly, the periods Ta(1), Ta(2), Ta(3), . . . in which the light-emitting chip Ca1 of the light-emitting chip group #a is controlled will be described below.

If the mutual relation of the signals to be described below is maintained, the length of the period T may be set to be variable.

In the periods Ta(1), Ta(2), Ta(3), . . . , the same signal waveforms are repeated except for the setting signals φW (the setting signals φW1~φW20) varying along with the image data.

Therefore, only the period Ta(1) from time c to time p will be described below. The period from time a to time c is a period in which the light-emitting chip Ca1(C) starts its operation. The signals in this period will be described with the description of the operation.

The signal waveforms of the first transmission signal φ1a, the second transmission signal φ2a, the enabling signal φEa, and the lighting signal φIa, in the period Ta(1) will be described.

The first transmission signal φ1a is "L" at time c, is changed from "L" to "H" at time n, and maintains "H" at time p.

The second transmission signal φ2a is "H" at time c, is changed from "H" to "L" at time m, and maintains "L" at time p.

Here, comparing the first transmission signal φ1a and the second transmission signal φ2a, the waveforms of the first transmission signal φ1a in the period Ta(1) is the same as the waveform of the second transmission signal φ2a in the period Ta(2). The waveform of the second transmission signal φ2a in the period Ta(1) is the same as the waveform of the first transmission signal φ1a in the period Ta(2).

That is, the first transmission signal φ1a and the second transmission signal φ2a have a signal waveform which is repeated with a cycle of double period (2T) of the period T. Like the period from time m to time n, "H" and "L" are alternately repeated with the period in which both are "L" interposed therebetween. The first transmission signal φ1a and the second transmission signal φ2a do not have the period in which both are simultaneously "H", except for the period from time a to time b.

The transmission thyristors T shown in FIG. 6 are sequentially turned on as described later by a pair of transmission signals of the first transmission signal φ1a and the second transmission signal φ2a, whereby the light-emitting thyristor L to be controlled to light or not to light (to be subjected to the lighting control) is designated.

The enabling signal φEa is "H" at time c, is changed from "H" to "L" at time d, is changed from "L" to "H" at time h, and maintains "H" at time p.

The enabling signal φEa sets the light-emitting thyristor L to be controlled to light or not to light (to be subjected to the lighting control) to one of a lighting-enabled state or a lighting-disabled state as described later.

The lighting signal φIa is changed from "H" to "L" at time c, is changed from "L" to "H" at time o, and maintains "H" at time p.

The lighting signal φIa supplies current for lighting (emission of light) to the light-emitting thyristors L.

The setting signal φW1 is set to "H" at time c, is changed from "H" to "L" at time e, is changed from "L" to "H" at time f, is changed from "H" to "L" at time k, and is changed from "L" to "H" at time 1. That is, the setting signal φW1 has two periods in which it is "L" in the period Ta(1).

Considering the relationship between the setting signal φW1 and the enabling signal φEa, the setting signal φW1 maintains "L" in the period from time e to time f which is included in the period from time d to time h in which the enabling signal φEa maintains "L".

On the other hand, considering the relationship between the setting signal φW1 and the enabling signal φEb which is transmitted with a phase difference of 180° from the enabling signal φEa, the setting signal φW1 maintains "L" in the period from time k to time 1 which is included in the period from time j to time o in which the enabling signal φEb in the period Tb(1) maintains "L".

That is, in the period Ta(1), the period (from time e to time f) in which the setting signal φW1 is first "L" serves as a signal for changing the light-emitting thyristor L1 of the light-emitting chip Ca1 to the lighting state and the period (from time k to time 1) in which the setting signal φW1 is later "L" serves as a signal for changing the light-emitting thyristor L1 of the light-emitting chip Cb1 to the lighting state.

Accordingly, the period (from time d to time h) in which the enabling signal φEa is "L" is set so as not to overlap with the period (from time k to time 1) in which the setting signal φW1 is "L" to change the light-emitting thyristor L1 of the light-emitting chip Cb1 to the lighting state. Similarly, the period (from time j to time o) in which the enabling signal φEb is "L" is set so as not to overlap with the period (from time e to time f) in which the setting signal φW1 is "L" to change the light-emitting thyristor L1 of the light-emitting chip Ca1 to the lighting state.

The operation of the light-emitting device 65 will be described with reference to FIGS. 4A and 4B and FIG. 6 and the timing diagram shown in FIG. 9. In the following description, the above-mentioned values are applied to the connecting resistor Rx, the resistor Rv, the resistor Rv', the resistor Ru, and the connecting resistor Rz.

(1) Time a

The state (the initial state) at time a when the supply of the reference potential Vsub and the source potential Vga to the light-emitting device 65 is started will be described.

Light-Emitting Device 65

At time a in the timing diagram shown in FIG. 8, the power supply line 200a is set to the reference potential Vsub of "H (0 V)" and the power supply line 200b is set to the source potential Vga of "L (−3.3 V)" (see FIGS. 4A and 4B). Accordingly, the Vsub terminals of all the light-emitting chips C (the light-emitting chips Ca1~Ca20 and the light-emitting chips Cb1~Cb20) are set to "H" and the Vga terminals thereof are set to "L" (see FIG. 6).

The transmission signal generator 120a of the signal generator circuit 110 sets the first transmission signal φ1a and the second transmission signal φ2a to "H" and the transmission signal generator 120b sets the first transmission signal φ1b and the second transmission signal φ2b to "H". Then, the first transmission signal lines 201a and 201b and the second transmission signal lines 202a and 202b are set to "H" (see FIGS. 4A and 4B). Accordingly, the φ1 terminals and the φ2 terminals of the light-emitting chips C (the light-emitting chips Ca1~Ca20 and the light-emitting chips Cb1~Cb20) are set to "H". The first transmission signal line 72 connected to the φ1 terminals via the current-limiting resistor R1 and the second transmission signal line 73 connected to the φ1 terminals via the current-limiting resistor R2 are both set to "H" (see FIG. 6).

The enabling signal generator 130a of the signal generator circuit 110 sets the enabling signal φEa to "H" and the enabling signal generator 130b sets the enabling signal φEb to "H". Then, the enabling signal lines 203a and 203b are set to "H" (see FIGS. 4A and 4B). Accordingly, the φE terminals of the light-emitting chips C are set to "H" and the enabling signal line 76 connected to the φE terminals via the current-limiting resistor RE is set to "H" (see FIG. 6).

The lighting signal generator 140a of the signal generator circuit 110 sets the lighting signal φIa to "H" and the lighting signal generator 140b sets the lighting signal φIb to "H". Then, the lighting signal lines 204a and 204b are set to "H" (see FIGS. 4A and 4B). The φI terminals of the light-emitting chips C connected to the lighting signal lines 204a and 204b via the current-limiting resistor RI are set to "H". The lighting signal line 75 connected to the φI terminals is set to "H" (see FIG. 6).

The setting signal generator 150 of the signal generator circuit 110 sets the setting signals φW1~φW20 to "H". Then, the setting signal lines 205 to 224 are set to "H" (see FIGS. 4A and 4B). Accordingly, the φW terminals of the light-emitting chips C is set to "H" (see FIG. 6).

The φW terminals of the light-emitting chips C are connected to the setting signal line 74 via the current-limiting resistor RW. Accordingly, the setting signal line 74 is set to "H" (see FIG. 6).

The operation of the light-emitting chips C (the light-emitting chips Ca1~Ca20 and the light-emitting chips Cb1~Cb20) will be described with reference to FIG. 6 and the timing diagram shown in FIG. 9, focusing on the light-emitting chips Ca1 and Cb1 belonging to the light-emitting chip set 41.

In FIG. 9 and the following description, it is shown and stated that the potentials of the terminals vary in a step shape, but the potentials of the terminals slowly vary. Accordingly, when the following conditions are satisfied even during the variation of the potentials, the thyristors are turned on or off, that is, changes the states.

Light-Emitting Chip Ca1

The anode terminals of the light-emitting thyristors L, the transmission thyristors T, the setting thyristors S, and the setting enabling thyristor S0 are connected to the Vsub terminal and thus are set to "H".

The cathode terminals of the odd transmission thyristors T1, T3, T5, . . . are connected to the first transmission signal line 72 and are set to "H". The cathode terminals of the even transmission thyristors T2, T4, T6, . . . are connected to the second transmission signal line 73 and are set to "H". Accordingly, the anode terminals and the cathode terminals of the transmission thyristors T are all set to "H" and thus the transmission thyristors T are in the OFF state.

Similarly, the cathode terminals of the setting thyristors S and the setting enabling thyristor S0 are connected to the setting signal line 74 and are set to "H" as described above. Accordingly, the anode terminals and the cathode terminals of the setting thyristors S and the setting enabling thyristor S0 are all set to "H" and thus the setting thyristors S and the setting enabling thyristor S0 are in the OFF state.

The cathode terminals of the light-emitting thyristors L are connected to the lighting signal line 75 and are set to "H". Accordingly, the anode terminals and the cathode terminals of the light-emitting thyristors L are all set to "H" and thus the light-emitting thyristors L are in the OFF state.

Since the light-emitting thyristors L, the transmission thyristors T, and the setting thyristors S are all in the OFF state, the gate terminals Gt of the transmission thyristors T, the gate terminals Gs of the setting thyristors S, and the gate terminals Gl of the light-emitting thyristors L are not fixed to "H" (0 V) which is the potential of the anode terminal.

The gate terminals Gl of the light-emitting thyristors L are connected to the power supply line 71 via the connecting resistors Rz. Accordingly, the potential of the gate terminal Gl is "L" (−3.3 V).

The gate terminals Gs of the setting thyristors S are connected to the power supply line 71 via the connecting resistors Rz and the connecting resistor Ry1. Accordingly, the potential of the gate terminals Gs is "L" (−3.3 V), except for the gate terminals Gs1 and Gs2 to be described later.

The gate terminals Gt of the transmission thyristors T are connected to the power supply line 71 via the connecting resistors Rz, the connecting resistors Ry, and the connecting resistors Rx. Accordingly, the potential of the gate terminals Gt is "L" (−3.3 V), except for the gate terminals Gt1 and Gt2 to be described later.

As described above, except for the transmission thyristors T1 and T2, the setting thyristors S1 and S2, and the light-emitting thyristors L1 and L2 to be described later, the threshold voltages of the transmission thyristors T, the setting thyristors S, and the light-emitting thyristors L are −4.8 V which is obtained by subtracting the pn-junction diffusion potential Vd (1.5 V) from the potential (−3.3 V) of the gate terminals Gt, Gm, and Gl thereof.

On the other hand, the gate terminal Gs0 of the setting enabling thyristor S0 is connected to the enabling signal line 76 of "H" (0 V). Accordingly, the threshold voltage of the setting enabling thyristor S0 is −1.5 V which is obtained by subtracting the pn-junction diffusion potential Vd (1.5 V) from the potential (0 V) of the gate terminal Gs0 thereof.

The gate terminal Gt1 of the transmission thyristor sequence shown in FIG. 6 is connected to the cathode terminal of the start diode D0, as described above. The anode terminal of the start diode D0 is connected to the second transmission signal line 73. The second transmission signal line 73 is set to "H". Then, since the cathode terminal of the start diode D0 is "L" and the anode terminal thereof is "H", the voltage is applied forward (forward bias). Accordingly, the potential of the cathode terminal (the gate terminal Gt1) of the start diode D0 is −1.5 V which is obtained by subtracting the diffusion potential Vd (1.5 V) of the start diode D0 from the "H" (0 V) of the anode terminal of the start diode D0. Therefore, the threshold voltage of the transmission thyristor T1 is −3.0 V which is obtained by subtracting the pn-junction diffusion potential Vd (1.5 V) from the potential (−1.5 V) of the gate terminal Gt1.

The gate terminal Gt2 of the transmission thyristor T2 adjacent to the transmission thyristor T1 is connected to the gate terminal Gt1 via the coupling diode D1. The potential of the gate terminal Gt2 of the transmission thyristor T2 is −3.0 V which is obtained by subtracting the pn-junction diffusion potential Vd (1.5 V) of the coupling diode D1 from the potential (−1.5 V) of the gate terminal Gt1. Accordingly, the threshold voltage of the transmission thyristor T2 is −4.5 V.

The threshold voltage of the transmission thyristors T of which the number is 3 or more is −4.8 V as described above.

On the other hand, the gate terminal Gs1 of the setting thyristor S1 is connected to the gate terminal Gt1 of −1.5 V via the connecting resistor Rx1. Accordingly, as described above, the threshold voltage of the setting thyristor S1 is −3.15 V. The threshold voltage of the light-emitting thyristor L1 is −4.35 V.

Similarly, the gate terminal Gs2 of the setting thyristor S2 is connected to the gate terminal Gt2 of −3.0 V via the connecting resistor Rx2. Accordingly, the threshold voltage of the setting thyristor S2 is −4.35 V. The threshold voltage of the light-emitting thyristor L2 is −4.73 V.

The threshold voltage of the setting thyristors S and the light-emitting thyristors L of which the number is 3 or more is −4.8 V as described above.

As described above, when the potential of the gate terminals Gt is −3.0 V, the threshold voltages of the setting thyristors S and the light-emitting thyristors L are lower than "L" (−3.3 V). Accordingly, even when the setting signals φW and the lighting signals φI are "L", the setting thyristors S and the light-emitting thyristors L are not turned on. Therefore, the case where the potential of the gate terminals Gt is −3 V will not be described.

Light-Emitting Chip Cb1

The initial state of the light-emitting chip Cb1 is the same as the light-emitting chip Ca1 and thus will not be described.

(2) Time b

At time b shown in FIG. 9, the first transmission signal φ1a transmitted to the light-emitting chip group #a is changed from "H" (0 V) to "L" (−3.3 V). Accordingly, the light-emitting device 65 starts its operation.

Light-Emitting Chip Ca1

The potential of the first transmission signal line 72 connected to the cathode terminals of the odd transmission thyristors T is changed from "H" to "L" (−3.3 V). Then, the transmission thyristor T1 of which the threshold voltage is −3.0 V is turned on. The potential of the first transmission signal line 72 is −1.5 V which is obtained by subtracting the pn-junction diffusion potential Vd (1.5 V) from "H" (0 V) of the anode terminal.

Accordingly, the odd transmission thyristors T subsequent to the transmission thyristor T3 of which the threshold voltage is −4.8 V are not turned on.

When the transmission thyristor T1 is turned on, the potential of the gate terminal Gt1 is "H" (0 V) which is the potential of the anode terminal. The potential of the cathode terminal (the first transmission signal line 72 in FIG. 6) of the transmission thyristor T1 is −1.5 V which is obtained by subtracting the pn-junction diffusion potential Vd (1.5 V) from "H" (0 V) of the anode terminal of the transmission thyristor T1. Then, the potential of the anode terminal (the gate terminal Gt1) of the coupling diode D1 of which the potential of the cathode terminal (the gate terminal Gt2) is −3 V is "H" (0 V) and thus is forward biased. Accordingly, the potential of the cathode terminal (the gate terminal Gt2) of the coupling diode D1 is 1.5 V which is obtained by subtracting the pn-junction diffusion potential Vd (1.5 V) from "H" (0 V) of the anode terminal (the gate terminal Gt1) thereof. Accordingly, the threshold voltage of the transmission thyristor T2 is −3.0 V.

The potential of the gate terminal Gt3 connected to the gate terminal Gt2 of the transmission thyristor T2 via the coupling diode D2 is −3.0 V. Accordingly, the threshold voltage of the transmission thyristor T3 is −4.5 V. Since the potential of the gate terminals Gt of the transmission thyristors T of which the number is 4 or more is the source voltage Vga ("L" (−3.3 V)), the threshold voltage thereof is maintained in −4.8 V.

On the other hand, when the transmission thyristor T1 is turned on and the potential of the gate terminal GU thereof is "H" (0 V), the threshold voltage of the setting thyristor S1 is −1.78 V, as described above. On the other hand, the threshold voltage of the light-emitting thyristor L1 is −3.98 V.

When the potential of the gate terminal Gt2 is −1.5 V, the threshold voltage of the setting thyristor S2 is −3.15 V and the threshold voltage of the light-emitting thyristor L2 is −4.35 V.

However, since the potentials of the setting signal line 74 and the lighting signal line 75 are "H", the setting thyristors S1 and S2 and the light-emitting thyristors L1 and L2 are not turned on.

That is, at time b, the transmission thyristor T1 is turned on. Just after time b (when it is in the normal state after the thyristors and the like are changed due to the variation in potential of the signals at time b), the transmission thyristor T1 is in the ON state. The other transmission thyristors T, all the light-emitting thyristors L, all the setting thyristors S, and the setting enabling thyristor S are in the OFF state. The thyristors (the light-emitting thyristors L, the transmission thyristors T, the setting thyristors 5, and the setting enabling thyristor S0) in the ON state will be described below and the thyristors (the light-emitting thyristors L, the transmission thyristors T, the setting thyristors S, and the setting enabling thyristor S0) in the OFF state will not be described.

Lighting-Emitting Chip Cb1

Since the signals transmitted to the light-emitting chip group #b to which the light-emitting chip Cb1 belongs are not changed, the light-emitting chip Cb1 is maintained in the initial state.

As described above, the gate terminals (the gate terminals Gt, Gs, and Gl) of the thyristors (the transmission thyristors T, the setting thyristors S, and the light-emitting thyristors L) are connected to each other via the diodes (the coupling diodes D), the resistors (the connecting resistors Rx and Ry and the connecting resistors Rz). Accordingly, when the potential of a gate terminal is changed, the potentials of the other gate terminals are changed. The threshold voltages of the thyristors are changed with the change in potential of the gate terminal.

(3) Time c

At time c, the lighting signal φIa transmitted to the light-emitting chip group #a is changed from "H" (0 V) to "L" (−3.3 V).

Light-Emitting Chip Ca1

The lighting signal line 75 connected to the cathode terminal of the light-emitting thyristors L is changed from "H" to "L" (−3.3 V). Since the threshold voltage of the light-emitting thyristor L1 is −3.98 V and the threshold voltage of the light-emitting thyristors L of which the number is 2 or more is −4.35 V or less, no light-emitting thyristor L is turned on.

Therefore, just after time c, the transmission thyristor T1 is in the ON state.

Light-Emitting Chip Cb1

Since the signals transmitted to the light-emitting chip group #b to which the light-emitting chip Cb1 belongs are not changed, the light-emitting chip Cb1 is maintained in the initial state.

(4) Time d

At time d, the enabling signal φEa transmitted to the light-emitting chip group #a is changed from "H" (0 V) to "L" (−3.3 V).

Light-Emitting Chip Ca1

The potential of the enabling signal line 76 connected to the gate terminal Gs0 of the setting enabling thyristor S0 is changed from "H" to "L" (−3.3 V). Then, the potential of the gate terminal Gs0 of the setting enabling thyristor S0 is −3.3 V and the threshold voltage of the setting enabling thyristor S0 is changed from −1.5 V to −4.8 V.

Just after time d, the transmission thyristor T1 is in the ON state.

Light-Emitting Chip Cb1

Since the signals transmitted to the light-emitting chip group #b to which the light-emitting chip Cb1 belongs are not changed, the light-emitting chip Cb1 is maintained in the initial state.

(5) Time e

At time e, the setting signal φW1 transmitted to the light-emitting chip set #1 to which the light-emitting chip Ca1 of the light-emitting chip group #a and the light-emitting chip Cb1 of the light-emitting chip group #b is changed from "H" (0 V) to "L" (−3.3 V).

Light-Emitting Chip Ca1

The potential of the setting signal line 74 connected to the cathode terminals of the setting thyristors S and the setting enabling thyristor S0 is changed from "H" to "L" (−3.3 V). The setting enabling thyristor S0 is not turned on, since the threshold voltage thereof is −4.8 V.

On the other hand, the setting thyristor S1 of which the threshold voltage is −1.78 V is turned on. The setting thyristor S2 of which the threshold voltage is −3.15 V is not turned on, since the setting thyristor S1 having the higher threshold voltage is first turned on and the setting signal line 74 connected to the cathode terminal of the setting thyristor S1 is set to −1.5 V which is obtained by subtracting the diffusion potential Vd from the potential of the anode terminal thereof.

When the setting thyristor S1 is turned on, the gate terminal Gs1 is changed to 0 V and the threshold voltage of the light-emitting thyristor L1 is changed to −1.89 V as described above.

At time c, since the lighting signal line 75 is "L" (−3.3 V), the light-emitting thyristor L1 is turned on and lights (emits light).

Accordingly, just after time e, the transmission thyristor T1 and the setting thyristor S1 are in the ON state, and the light-emitting thyristor L1 is in the ON state and lights (emits light).

Light-Emitting Chip Cb1

The potential of the setting signal line 74 connected to the cathode terminals of the setting thyristors S and the setting enabling thyristor S0 is changed from "H" to "L" (−3.3 V). The setting enabling thyristor S0 of which the threshold voltage is −1.5 V is turned on to set the potential of the setting signal line 74 to −1.5 V. The threshold voltage of the setting thyristor S1 is −3.15 V but the setting enabling thyristor S0 of which the threshold voltage is higher than −1.5 V is first turned on. Accordingly, the setting thyristor S1 is not turned on. Therefore, the threshold voltage of the light-emitting thyristor L1 is maintained in −4.35 V.

Just after time e, the setting enabling thyristor S0 is in the ON state.

(6) Time f

At time f, the setting signal ϕW1 transmitted to the light-emitting chip set #1 to which the light-emitting chip Ca1 of the light-emitting chip group #a and the light-emitting chip Cb1 of the light-emitting chip group #b is changed from "L" (−3.3 V) to "H" (0 V).

Light-Emitting Chip Ca1

The potential of the setting signal line 74 connected to the cathode terminals of the setting thyristors S and the setting enabling thyristor S0 is changed from "L" to "H" (0 V). The setting thyristor S1 is turned off, since the potentials of the anode terminal and the cathode terminal of the setting thyristor S1 are both "H" (0 V).

However, the light-emitting thyristor L1 is maintained in the ON state and lights (emits light).

Since the light-emitting thyristor L1 is in the ON state, the potential of the gate terminal Gl1 is 0 V. The potential of the gate terminal Gt1 is also 0 V. Accordingly, the potential of the gate terminal Gs1 is 0 V and the threshold voltage of the setting thyristor S1 is −1.5 V.

Accordingly, just after time f, the transmission thyristor T1 is in the ON state and the light-emitting thyristor L1 is in the ON state to light (to emit light).

Light-Emitting Chip Cb1

The potential of the setting signal line 74 connected to the cathode terminals of the setting thyristors S and the setting enabling thyristor S0 is changed from "L" to "H" (0 V). The setting enabling thyristor S0 is turned off, since the potentials of the anode terminal and the cathode terminal of the setting enabling thyristor S0 are both "H" (0 V).

(7) Time g

At time g, the first transmission signal ϕ1b transmitted to the light-emitting chip group #b is changed from "H" (0 V) to "L" (−3.3 V).

Light-Emitting Chip Ca1

Since the signals transmitted to the light-emitting chip group #a to which the light-emitting chip Ca1 belongs are not changed, the state just after time f is maintained.

Light-Emitting Chip Cb1

The operation of the light-emitting chip Cb1 is similar to the operation of the light-emitting chip Ca1 at time b. That is, the potential of the first transmission signal line 72 connected to the cathode terminals of the odd transmission thyristors T is changed from "H" to "L" (−3.3 V). Then, the transmission thyristor T1 is turned on. Accordingly, the potential of the first transmission signal line 72 is −1.5 V. The threshold voltage of the transmission thyristor T2 is −3.0 V and the threshold voltage of the setting thyristor S1 is −1.78 V.

That is, the light-emitting chip Cb1 operates at the timing (here, the phase is different by 180°) obtained by shifting the operation of the light-emitting chip Ca1 in the time axis.

(8) Time h

At time h, the enabling signal ϕEa transmitted to the light-emitting chip group #a is changed from "L" (−3.3 V) to "H" (0 V).

Light-Emitting Chip Ca1

The potential of the enabling signal line 76 connected to the gate terminal Gs0 of the setting enabling thyristor S0 is changed from "L" to "H" (0 V). Then, the potential of the gate terminal Gs0 of the setting enabling thyristor S0 is 0 V and the threshold voltage of the setting enabling thyristor S0 is returned to −1.5 V. Since the potential of the setting signal line 74 is "H" (0 V), the setting enabling thyristor S0 is not turned on.

Here, the light-emitting thyristor L1 is maintained in the ON state to light (to emit light).

Accordingly, just after time h, the transmission thyristor T1 is in the ON state and the light-emitting thyristors L1 is in the ON state to light (to emit light).

Light-Emitting Chip Cb1

Since the signals transmitted to the light-emitting chip group #b to which the light-emitting chip Cb1 belongs are not changed, the state just after time g is maintained.

(9) Time i

At time i, the lighting signal ϕIb transmitted to the light-emitting chip group #b is changed from "H" (0 V) to "L" (−3.3 V).

Light-Emitting Chip Ca1

Since the signals transmitted to the light-emitting chip group #a to which the light-emitting chip Ca1 belongs are not changed, the state just after time h is maintained.

Light-Emitting Chip Cb1

The operation of the light-emitting chip Cb1 is similar to the operation of the light-emitting chip Ca1 at time c and thus the detailed description is not repeated.

Just after time i, the transmission thyristor T1 is in the ON state.

(10) Time j

At time j, the enabling signal ϕEb transmitted to the light-emitting chip group #b is changed from "H" (0 V) to "L" (−3.3 V).

Light-Emitting Chip Ca1

Since the signals transmitted to the light-emitting chip group #a to which the light-emitting chip Ca1 belongs are not changed, the state just after time h is maintained.

Light-Emitting Chip Cb1

Similarly to the operation of the light-emitting chip Ca1 at time d, the threshold voltage of the setting enabling thyristor S0 is −4.8 V.

Just after time j, the transmission thyristor T1 is in the ON state.

(11) Time k

At time k, the setting signal ϕW1 transmitted to the light-emitting chip set #1 to which the light-emitting chip Ca1 of the light-emitting chip group #a and the light-emitting chip Cb1 of the light-emitting chip group #b is changed from "H" (0 V) to "L" (−3.3 V).

Light-Emitting Chip Ca1

The potential of the setting signal line 74 connected to the cathode terminals of the setting thyristors S and the setting enabling thyristor S0 is changed from "H" to "L" (−3.3 V).

The threshold voltage of the setting enabling thyristor S0 and the threshold voltage of the setting thyristor S1 are both −1.5 V.

Therefore, both or one of the setting enabling thyristor S0 and the setting thyristor S1 is turned on. Even when the setting thyristor S1 is turned on, the light-emitting thyristor L1 is in the ON state yet and thus does not change its state.

Accordingly, the light-emitting thyristor L1 is maintained on the ON state and lights (emits light).

Just after time k, the transmission thyristor T1, the setting enabling thyristor S0, and/or the setting thyristor S1 are in the ON state and the light-emitting thyristor L1 is in the ON state to light (to emit light).

As described later, when the light-emitting thyristor L1 is in the OFF state, the threshold voltage of the setting thyristor S1 is −1.78 V and the setting enabling thyristor S0 of which the threshold voltage is −1.5 V is turned on.

Light-Emitting Chip Cb1

Similarly to the operation of the light-emitting chip Ca1 at time e, the potential of the setting signal line 74 connected to the cathode terminals of the setting thyristors S and the setting enabling thyristor S0 is changed from "H" to "L" (−3.3 V). The setting enabling thyristor S0 is not turned on, since the threshold voltage thereof is −4.8 V. On the other hand, the setting thyristor S1 of which the threshold voltage is −1.78 V is turned on. Accordingly, since the threshold voltage of the light-emitting thyristor L1 is −1.5 V, the light-emitting thyristor L1 is turned on and lights (emits light).

Just after time k, the transmission thyristor T1 and the setting thyristor S1 are in the ON state, and the light-emitting thyristor L1 is in the ON state and lights (emits light).

(12) Time 1

At time 1, the setting signal ϕW1 transmitted to the light-emitting chip set #1 to which the light-emitting chip Ca1 of the light-emitting chip group #a and the light-emitting chip Cb1 of the light-emitting chip group #b is changed from "L" (−3.3 V) to "H" (0 V).

Light-Emitting Chip Ca1

The setting signal line 74 connected to the cathode terminals of the setting thyristors S and the setting enabling thyristor S0 is changed from "L" to "H" (0 V). Accordingly, the setting enabling thyristor S0 and/or the setting thyristor S1 are turned off, since the anode terminal and the cathode terminal thereof are both changed to "H" (0 V). Here, the light-emitting thyristor L1 is maintained in the ON state and lights (emits light).

Just after time 1, the transmission thyristor T1 is in the ON state, and the light-emitting thyristor L1 is in the ON state and thus lights (emits light).

Light-Emitting Chip Cb1

Similarly to the operation of the light-emitting chip Ca1 at time f, the setting thyristor S1 is turned off. However, the light-emitting thyristor L1 is maintained in the ON state and lights (emits light).

Just after time f, the transmission thyristor T1 is in the ON state, and the light-emitting thyristor L1 is in the ON state and lights (emits light).

(13) Time m

At time m, the second transmission signal ϕ2a transmitted to the light-emitting chip group #a is changed from "H" (0 V) to "L" (−3.3 V).

Light-Emitting Chip Ca1

The potential of the second transmission signal line 73 connected to the cathode terminals of the even transmission thyristors T is changed from "H" to "L" (−3.3 V). The transmission thyristor T2 of which the threshold voltage is −3 V is turned on. However, since the threshold voltages of the even transmission thyristors T of which the number is greater than that of the transmission thyristor T4 or more are −4.8 V, they are not turned on.

When the transmission thyristor T2 is turned on, the potential of the gate terminal Gt2 is "H" (0 V). Then, the potential of the gate terminal Gt3 connected to the gate terminal Gt2 of the transmission thyristor T2 via the coupling diode D2 is −1.5 V. Accordingly, the threshold voltage of the transmission thyristor T3 is −3.0 V. The potential of the second transmission signal line 73 is −1.5 V.

On the other hand, when the transmission thyristor T2 is turned on and the potential of the gate terminal Gt2 is "H" (0 V), the threshold voltage of the setting thyristor S2 is −1.78 V as described above. However, since the potential of the setting signal line 74 is "H", the setting thyristor S2 is not turned on.

The threshold voltage of the light-emitting thyristor L2 is −3.98 V. At this time, since the potential of the lighting signal line 75 is changed to −1.5 V due to the light-emitting thyristor L1 in the ON state, the light-emitting thyristor L2 is not turned on.

That is, at time m, the transmission thyristor T2 is turned on.

Just after time m, the transmission thyristor T1 and the transmission thyristor T2 are in the ON state, and the light-emitting thyristor L1 is in the ON state and lights (emits light).

Light-Emitting Chip Cb1

Since the signals transmitted to the light-emitting chip group #b to which the light-emitting chip Cb1 belongs are not changed, the state just after time 1 is maintained.

(14) Time n

At time n, the first transmission signal ϕ1a transmitted to the light-emitting chip group #a is changed from "L" (−3.3 V) to "H" (0 V).

Light-Emitting Chip Ca1

The potential of the first transmission signal line 72 connected to the cathode terminals of the odd transmission thyristors T is changed from "L" to "H" (0 V). The transmission thyristor T1 in the ON state is turned off, since the potentials of the cathode terminal and the anode terminal are both "H". However, since the light-emitting thyristor L1 is in the ON state, the potential of the gate terminal Gl1 is "H" (0 V). Accordingly, the potential of the gate terminal Gt1 is "H" (0 V) and the threshold voltage of the transmission thyristor T1 is −1.5 V.

Similarly, since the potential of the gate terminal Gs1 of the setting thyristor S1 is 0 V, the threshold voltage of the setting thyristor S1 is −1.5 V.

Just after time n, the transmission thyristor T2 is in the ON state, and the light-emitting thyristor L1 is in the ON state and lights (emits light).

Light-Emitting Chip Cb1

Since the signals transmitted to the light-emitting chip group #b to which the light-emitting chip Cb1 belongs are not changed, the state at time 1 is maintained.

(15) Time o

At time o, the lighting signal ϕIa transmitted to the light-emitting chip group #a is changed from "L" (−3.3 V) to "H" (0 V). The enabling signal ϕEb transmitted to the light-emitting chip group #b is changed from "L" (−3.3 V) to "H" (0 V).

Light-Emitting Chip Ca1

The potential of the lighting signal line 75 connected to the cathode terminals of the light-emitting thyristors L is changed from "L" to "H" (0 V). The light-emitting thyristor L1 in the ON state is turned off and extinguished (not emit light), since the potentials of the cathode terminal and the anode terminal are both "H". Accordingly, the potentials of the gate terminals Gl1, Gs1, and Gt1 are source potential Vga ("L" (−3.3 V)) via the connecting resistor Rz and the connecting resistors Rx and Ry. Accordingly, the threshold voltage of the transmission thyristor T1 is −4.8 V, the threshold voltage of the setting thyristor S1 is −1.78 V, and the threshold voltage of the light-emitting thyristor L1 is −3.98 V.

The light-emitting thyristor L1 of the light-emitting chip Ca1 lights (emits light) (is turned on) at the timing of changing the setting signal φW1 from "H" to "L" at time e and is extinguished (is turned off) at the timing of changing the lighting signal φIa from "L" to "H" at time o. The period from time e to time o corresponds to the light (light-emitting) period of the light-emitting thyristor L1 of the light-emitting chip Ca1.

Just after time o, the transmission thyristor T2 is in the ON state.

Light-Emitting Chip Cb1

When the enabling signal φEb transmitted to the light-emitting chip group #b is changed from "L" (−3.3 V) to "H" (0 V), the potential of the enabling signal line 76 is changed from "L" to "H" similarly to the operation of the light-emitting chip Ca1 at time h. Accordingly, the threshold voltage of the setting thyristor S1 is −1.5 V.

Just after time o, the transmission thyristor T1 is in the ON state, and the light-emitting thyristor L1 is in the ON state and lights (emits light).

In this exemplary embodiment, at time o, the lighting signal φIa transmitted to the light-emitting chip group #a is changed from "L" to "H" and the enabling signal φEb transmitted to the light-emitting chip group #b is changed from "L" to "H". However, these changes are not necessarily performed at the same time and any one thereof may be first performed.

(16) Time p

At time p, the lighting signal φIa transmitted to the light-emitting chip group #a is changed from "H" (0 V) to "L" (−3.3 V).

Light-Emitting Chip Ca1

From time p, the period Ta(2) in which the lighting of the light-emitting thyristor L2 is started.

Since the first transmission signal φ1a and the second transmission signal φ2a are changed with a cycle of the periods Ta(1) and Ta(2), the signal waveforms thereof are different. However, the light-emitting chip Ca1 repeatedly performs the operation in the period Ta(1) from time c to time p. Accordingly, the operation of the light-emitting chip Ca1 in the period Ta(2) is not described, except for the explanation of the first transmission signal φ1a and the second transmission signal φ2a and the transmission thyristors T based thereon.

Just after time p, the transmission thyristor T2 is in the ON state.

Light-Emitting Chip Cb1

Since the signals transmitted to the light-emitting chip group #b to which the light-emitting chip Cb1 belongs are not changed, the state just after time o is maintained.

Time q is used in a second exemplary embodiment to be described later. Accordingly, the operation at time q is not described in the first exemplary embodiment.

(17) Time r

At time r, the enabling signal φEa transmitted to the light-emitting chip group #a is changed from "L" (−3.3 V) to "H" (0 V). The lighting signal φ1b transmitted to the light-emitting chip group #b is changed from "L" (−3.3 V) to "H" (0 V).

Light-Emitting Chip Ca1

The operation is similar to the operation at time h and thus is not described.

Just after time r, the transmission thyristor T2 is in the ON state and the light-emitting thyristor L2 lights (emits light).

Light-Emitting Chip Cb1

Similarly to the operation of the light-emitting chip Ca1 at time o, the lighting signal φIb is changed from "L" (−3.3 V) to "H" (0 V) and the lighting signal line 75 of the cathode terminals of the light-emitting thyristors L is changed from "L" to "H" (0 V). Then, the light-emitting thyristor L1 in the ON state is turned off and is extinguished, since the cathode terminal and the anode terminal thereof are both "H". Accordingly, the threshold voltage of the transmission thyristor T1 is −4.8 V, the threshold voltage of the setting thyristor S1 is −1.78 V, and the threshold voltage of the light-emitting thyristor L1 is −3.98 V.

That is, the light-emitting thyristor L1 of the light-emitting chip Cb1 lights (emits light) (is turned on) at the timing of changing the setting signal φW1 from "H" to "L" at time k and is extinguished (is turned off) at the timing of changing the lighting signal φIb from "L" to "H" at time r. The period from time k to time r corresponds to the lighting (light-emitting) period of the light-emitting thyristor L1 of the light-emitting chip Cb1.

Just after time r, the transmission thyristor T2 is in the ON state.

(18) Time s

At time s, the period Tb(1) in which the light-emitting thyristor L1 of the light-emitting chip group #b is controlled is ended.

(19) Time t

At time t, the first transmission signal φ1a transmitted to the light-emitting chip group #a to which the light-emitting chip Ca1 belongs is changed from "H" (0 V) to "L" (−3.3 V).

Light-Emitting Chip Ca1

The potential of the first transmission signal line 72 connected to the cathode terminals of the odd transmission thyristors T is changed from "H" to "L" (−3.3 V). The transmission thyristor T3 of which the threshold voltage is −3V is turned on. Then, the potential of the gate terminal Gt3 is "H" (0 V) and the potential of the gate terminal Gt4 is −1.5 V. Accordingly, the threshold voltage of the transmission thyristor T4 is −3 V, the threshold voltage of the setting thyristor S3 is −1.78 V, and the threshold voltage of the light-emitting thyristor L3 is −3.98 V.

Just after time t, the transmission thyristors T2, and T3 are in the ON state, and the light-emitting thyristor L2 is in the ON state and lights (emits light).

Light-Emitting Chip Cb1

Since the signals transmitted to the light-emitting chip group #b to which the light-emitting chip Cb1 belongs are not changed, the state thereof is not changed.

Just after time t, the transmission thyristor T2 is in the ON state, and the light-emitting thyristor L2 is in the ON state and lights (emits light).

(20) Time u

At time u, the second transmission signal φ2a transmitted to the light-emitting chip group #a to which the light-emitting chip Ca1 belongs is changed from "L" (−3.3 V) to "H" (0 V).

Light-Emitting Chip Ca1

The potential of the second transmission signal line 73 connected to the cathode terminals of the even transmission thyristors T is changed from "L" to "H" (0 V). The transmission thyristor T2 in the ON state is turned off, since the cathode terminal and the anode terminal thereof are both "H".

Just after time u, the transmission thyristors T3 is in the ON state, and the light-emitting thyristor L2 is in the ON state and lights (emits light).

Light-Emitting Chip Cb1

Since the signals transmitted to the light-emitting chip group #b to which the light-emitting chip Cb1 belongs are not changed, the state thereof is not changed.

Just after time u, the transmission thyristor T2 is in the ON state, and the light-emitting thyristor L2 is in the ON state and lights (emits light).

(21) Others

At time v, the period Ta(2) in which the light-emitting thyristor L2 of the light-emitting chip group #a is controlled is ended. At time w, the period Tb(2) in which the light-emitting thyristor L2 of the light-emitting chip group #b is controlled is ended. At time x, the period Ta(3) in which the light-emitting thyristor L3 of the light-emitting chip group #a is controlled is ended. At time y, the period Tb(3) in which the light-emitting thyristor L3 of the light-emitting chip group #b is controlled is ended. At time z, the period Ta(4) in which the light-emitting thyristor L4 of the light-emitting chip group #a is controlled is ended. In this way, the lighting of all the light-emitting thyristors L of the light-emitting chip C is controlled.

The operation of the light-emitting chip C described above will be explained in a bundle.

The operation of the transmission thyristors T will be first described.

In the light-emitting chip C according to the first exemplary embodiment, the transmission thyristors T are sequentially turned on by the use of two-phase transmission signals (the first transmission signal $\phi1$ and the second transmission signal $\phi2$).

That is, by changing one transmission signal of the two-phase transmission signals to "L" (−3.3 V), the transmission thyristors T of which the cathode terminal is supplied with one transmission signal is turned on and the potential of the gate terminal Gt is 0 V. The potential of the gate terminals Gt of the adjacent transmission thyristors T connected to the gate terminal Gt of 0 V with the forwardly-biased coupling diode D is −1.5 V. Accordingly, the threshold voltage of the adjacent transmission thyristors T is enhanced (from −4.5 V to −3 V). The adjacent transmission thyristors T are turned on at the timing of changing the other transmission signal to "L" (−3.3 V).

That is, by transmitting the two-phase transmission signals (the first transmission signal $\phi1$ and the second transmission signal $\phi2$) with different phases so that the periods of "L" (−3.3 V) overlaps (the period from time m to time n in FIG. 9), the transmission thyristors T are sequentially turned on.

When the transmission thyristor T is in the ON state and the potential of the gate terminal Gt thereof is "H" (0 V), the threshold voltage of the setting thyristor S connected to the gate terminal Gt via the connecting resistor Rx is enhanced (−1.78 V).

When the enabling signal $\phi E$ (the enabling signal $\phi Ea$ or $\phi Eb$) is "L" and the setting signal $\phi W$ (the setting signals $\phi W1$~$\phi W20$) is changed from "H" to "L", the potential of the setting signal line 74 is changed to "L" (−3.3 V) and the setting thyristor S of which the threshold voltage has been enhanced (−1.78 V) is turned on.

When the setting thyristor S is turned on, the potential of the gate terminal Gs of the setting thyristor S is 0 V, the potential of the gate terminal Gl connected to the gate terminal Gs via the connecting resistor Ry is 0 V, and the threshold voltage of the light-emitting thyristor L is −1.5 V.

By setting the lighting signal $\phi I$ ($\phi Ia$ or $\phi Ib$) to "L" (−3.3 V) before the time of changing the setting signal $\phi W$ ($\phi W1$~$\phi W20$) to "L" (−3.3 V), the light-emitting thyristor L is turned on and lights (emits light) at the timing (time) of changing the setting signal $\phi W$ ($\phi W1$~$\phi W20$) from "H" to "L".

As described above, the lighting period in which the light-emitting thyristors L light (emit light) ranges from the timing (time) of changing the setting signal $\phi w$ (the setting signals $\phi W1$~$\phi W20$) from "H" to "L" to the time of changing the lighting signal $\phi I$ ($\phi Ia$ or $\phi Ia$) from "L" to "H" (for example, from time e to time o in FIG. 9).

On the other hand, when the enabling signal $\phi E$ (the enabling signal $\phi Ea$ or $\phi Eb$) is "H" at the time of changing the setting signal $\phi W$ (the setting signals $\phi W1$~$\phi W20$) from "H" to "L", the setting enabling thyristor S0 is turned on to set the setting signal line 74 to −1.5 V (−Vd). Accordingly, the setting thyristors S are not turned on and the light-emitting thyristors L are not turned on.

As described above, when the light-emitting thyristors L are in the ON state already, the setting thyristors S may be turned on. However, when the light-emitting thyristors L are in the ON state already, the state is not changed even by turning on the setting thyristors S.

In this way, in the light-emitting chip C in which the enabling signal $\phi E$ is "L", the setting enabling thyristor S0 is in the OFF state and the light-emitting thyristors L light (emit light) by changing the setting signal $\phi W$ from "H" to "L". On the other hand, when the enabling signal $\phi E$ is "H", the setting enabling thyristor S0 is turned on to prevent the light-emitting thyristors L from being turned on light (to emit light), by changing the setting signal $\phi W$ from "H" to "L". As described above, when the light-emitting thyristors L are in the ON state, the state is not changed.

That is, the enabling signals $\phi E$ (the enabling signal $\phi Ea$ and $\phi Eb$) control the threshold voltage of the setting enabling thyristor S0 to set the enabling or disabling of the turning-on of the light-emitting thyristors L.

In this exemplary embodiment, when all the light-emitting chips C in the light-emitting chip set including the light-emitting chips C belonging to the light-emitting chip group #a and the light-emitting chip group #b are made to light (emit light), two periods of "L" (the period from time e to time f and the period from time k to time 1 in FIG. 9) are provided to the setting signals $\phi W$ ($\phi W1$~$\phi W20$) transmitted in common. That is, the previous period of "L" sets the start of lighting for the light-emitting chips C of the light-emitting chip group #a and the subsequent period of "L" sets the start of lighting for the light-emitting chips C of the light-emitting chip group #b.

In this exemplary embodiment, the phases of the transmission signals (the first transmission signals $\phi1a$ and $\phi1b$ or the second transmission signals $\phi2a$ and $\phi2b$), the enabling signal $\phi E$ (the enabling signal $\phi Ea$ or $\phi Eb$), and the lighting signal $\phi I$ (the lighting signal $\phi Ia$ or $\phi Ib$) independently transmitted to the light-emitting chip group #a and the light-emitting chip group #b are made to different from each other by 180°. Accordingly, the width (margin) for setting two periods of "L" in the setting signals $\phi W$ (the setting signals $\phi W1$~$\phi W20$) is maximized.

That is, since the phases are different by 180°, two periods of "L" provided to the setting signals $\phi W$ can be disposed in the first half and the second half of the period T, respectively.

The light-emitting thyristors L are made to light by changing the setting signals $\phi W$ ($\phi W1$~$\phi W20$) from "H" to "L" in the period in which the enabling signal $\phi E$ (the enabling signal $\phi Ea$ or $\phi Eb$) is "L".

That is, when the light-emitting thyristors L of the light-emitting chips C of the light-emitting chip group #a are made to light, the setting signals $\phi W$ ($\phi W1$~$\phi W20$) can be changed from "H" to "L" in the period in which the enabling signal φEa transmitted to the light-emitting chip group #a is "L". At this time, when the light-emitting thyristors L of the light-emitting chips C of the light-emitting chip group #b are not made to light, the setting enabling thyristor S0 can be turned on by changing the enabling signal φEb transmitted to the light-emitting chip group #b to "H". Accordingly, it is possible to suppress the light-emitting thyristors L from unintentionally lighting.

An example where some of the light-emitting thyristors L are not made to light in the light-emitting chips Ca2 and Cb2 belonging to the light-emitting chip set #2 will be described below.

As described above, in the light-emitting chip set #2, it is assumed that the light-emitting thyristors L2, L3, and L4 of the light-emitting chip Ca2 are intended to light and the light-emitting thyristors L1, L3, and L4 of the light-emitting chip Cb2 are intended to light. The light-emitting thyristor L1 of the light-emitting chip Ca2 and the light-emitting thyristor L2 of the light-emitting chip Cb2 are maintained in the non-lighting state.

When the light-emitting thyristor L1 of the light-emitting chip Ca2 is maintained in the non-lighting state (is not made to light), the setting signal φW2 can be maintained in the "H" state in the period from time e to time f in which the setting signal φW1 is maintained in the "L" to cause the light-emitting thyristor L1 of the light-emitting chip set #1 to light. Accordingly, at time e, the setting thyristor S1 of which the threshold voltage is −1.78 is not turned on by maintaining the setting signal line 74 of the light-emitting chip Ca2 in the "H" (0 V) state. Accordingly, the threshold voltage of the light-emitting thyristor L1 is maintained in −3.98 V and the light-emitting thyristor L1 is not turned on and does not light (does not emit light).

The same is true of the light-emitting thyristor L2 of the light-emitting chip Cb2.

The light intensity of a light-emitting thyristor L may be uneven between the light-emitting chips C or between the light-emitting thyristors L due to the uneven manufacturing conditions and the like. Accordingly, the correcting of the light intensity of the light-emitting thyristor L is carried out. The method of correcting light intensity includes a method of adjusting current flowing in the light-emitting thyristor L and a method of adjusting the lighting period of the light-emitting thyristor L.

As described above, the lighting period of the light-emitting thyristor L extends from the time of changing the setting signal φW from "H" to "L" to turn on the light-emitting thyristor L to the time of changing the lighting signal φI from "L" to "H" to turn off (extinguish) the light-emitting thyristors L. Accordingly, by adjusting the time (for example time e in FIG. 9) at which the setting signal φW is changed from "H" to "L", the light intensity of the light-emitting thyristor is corrected. A nonvolatile memory such as a ROM to which data (light intensity correction data) for correcting the light intensity corresponding to the light-emitting thyristor L can be mounted on the circuit board 62, the light intensity correction data is read from the ROM, and the time of changing the setting signal φW from "H" to "L" is adjusted.

Light-Emitting Chip C not Employing First Exemplary Embodiment

An example where the first exemplary embodiment is not employed will be described below. The example where the first exemplary embodiment is not employed is different from the first exemplary embodiment in the configuration of the light-emitting chip C. The other configuration is the same as the first exemplary embodiment. Accordingly, the different configuration from the first exemplary embodiment will be described and the same configuration will not be described.

Figure 10:
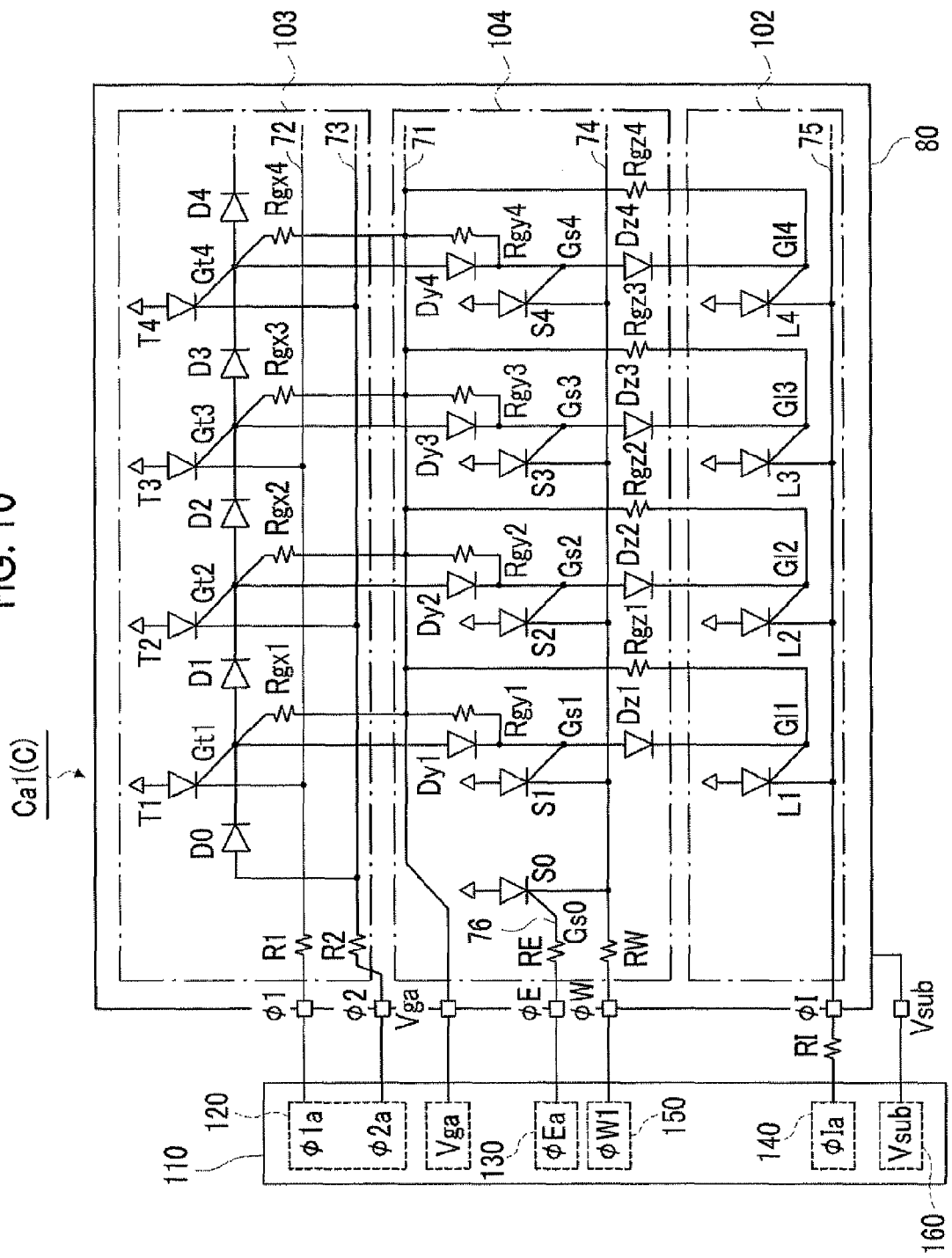
FIG. 10 is an equivalent circuit diagram illustrating the circuit configuration of a light-emitting chip which is a self-scanning light-emitting element array (SLED) chip to which the first exemplary embodiment is not applied.

FIG. 10 is an equivalent circuit diagram illustrating the circuit configuration of a light-emitting chip C which is a self-scanning light-emitting element array (SLED) in the example where the first exemplary embodiment is not employed.

The example where the first exemplary embodiment is not employed as shown in FIG. 10 is different from the first exemplary embodiment shown in FIG. 6, in the connecting method of the gate terminals Gt of the transmission thyristors T, the gate terminals Gs of the setting thyristors S, and the gate terminals Gl of the light-emitting thyristors L. That is, both are different from each other, in the method of coupling the transmission thyristors T, the setting thyristors S, and the light-emitting thyristors L.

Here, a light-emitting chip Ca1 is described as an example of a light-emitting chip C. Therefore, in FIG. 10 the light-emitting chip C is referred to as the light-emitting chip Ca1 (C). The configurations of the other light-emitting chips Ca2~Ca20 and Cb1~Cb20 are the same as the light-emitting chip Ca1.

The light-emitting chip Ca1(C) in the example where the first exemplary embodiment is not employed as shown in FIG. 10 includes connecting diodes Dy1, Dy2, Dy3, . . . connecting diodes Dz1, Dz2, Dz3, . . . , power supply line resistors Rgx1, Rgx2, Rgx3, . . . , power supply line resistors Rgy1, Rgy2, Rgy3, . . . , and power supply line resistors Rgz1, Rgz2, Rgz3, . . . , instead of the connecting resistors Rx and Ry and the connecting resistors Rz in the first exemplary embodiment shown in FIG. 6.

Like the light-emitting thyristors L, when the connecting diodes Dy1, Dy2, Dy3, . . . , the connecting diodes Dz1, Dz2, Dz3, . . . , the power supply line resistors Rgx1, Rgx2, Rgx3, . . . , the power supply line resistors Rgy1, Rgy2, Rgy3, . . . , and the power supply line resistors Rgz1, Rgz2, Rgz3, . . . are not distinguished individually, they are referred to as the connecting diodes Dy, the connecting diodes Dz, the power supply line resistors Rgx, the power supply line resistors Rgy, and the power supply line resistors Rgz, respectively.

The electrical connection of the elements in the light-emitting chip Ca1 (C) will be described below.

The gate terminals Gt1, Gt2, Gt3, . . . of the transmission thyristors T are connected to the gate terminals Gs1, Gs2, Gs3, . . . of the setting thyristors S1, S2, S3, . . . having the same number in a one-to-one manner via the connecting diodes Dy1, Dy2, Dy3, . . . . The anode terminals of the connecting diodes Dy1, Dy2, Dy3, . . . are connected to the gate terminals Gt1, Gt2, Gt3, . . . of the transmission thyristors T1, T2, T3, . . . , and the cathode terminals of the connecting diodes Dy1, Dy2, Dy3, . . . are connected to the gate terminals Gs1, Gs2, Gs3, . . . of the setting thyristors S1, S2, S3, . . . .

The gate terminals Gs1, Gs2, Gs3, . . . of the setting thyristors S1, S2, S3, . . . are connected to the gate terminals Gl1, Gl2, Gl3, . . . of the light-emitting thyristors L1, L2, L3, . . . having the same number in a one-to-one manner via the connecting diodes Dz1, Dz2, Dz3, . . . , respectively. The anode terminals of the connecting diodes Dz1, Dz2, Dz3, . . . are connected to the gate terminals Gs1, Gs2, Gs3, . . . of the setting thyristors S1, S2, S3, . . . and the cathode terminals of the connecting diodes Dz1, Dz2, Dz3, . . . are connected to the gate terminals Gl1, Gl2, Gl3, . . . of the light-emitting thyristors L1, L2, L3, . . . .

That is, the connecting diodes Dy are connected in the direction in which current flows from the gate terminals Gt of the transmission thyristors T to the gate terminals Gs of the setting thyristors S. Similarly, the connecting diodes Dz are connected in the direction in which current flows from the gate terminals Gs of the setting thyristors S to the gate terminals Gl of the light-emitting thyristors L.

The gate terminals Gt of the transmission thyristors T are connected to the power supply line 71 via the power supply line resistors Rgx disposed to correspond to the transmission thyristors T.

The gate terminals Gs of the setting thyristors S are connected to the power supply line 71 via the power supply line resistors Rgy disposed to correspond to the setting thyristors S.

The gate terminals Gl of the light-emitting thyristors L are connected to the power supply line 71 via the power supply line resistors Rgz disposed to correspond to the light-emitting thyristors L.

In the light-emitting chip C in the example where the first exemplary embodiment is not employed, the transmission thyristors T, the setting thyristors S, and the light-emitting thyristors L are coupled to each other via diodes. Accordingly, the light-emitting chip C in the example where the first exemplary embodiment is not employed is referred to as a diode-coupled type.

On the other hand, in the light-emitting chip C according to the first exemplary embodiment, the transmission thyristors T, the setting thyristors S, and the light-emitting thyristors L are coupled to each other via the resistors. Accordingly, the light-emitting chip C according to the first exemplary embodiment is referred to as a resistor-coupled type.

The operation of the diode-coupled light-emitting chip C in the example where the first exemplary embodiment is not employed will be described below. When the diode-coupled light-emitting chip C is used, the light-emitting device 65 and the light-emitting chip C operate on the basis of the timing diagram shown in FIG. 9. However, the threshold voltages and the operating speeds of the setting thyristors S and the light-emitting thyristors L are different.

The threshold voltages of the setting thyristors S and the light-emitting thyristors L in the light-emitting chip C will be described below.

In the diode-coupled light-emitting chip C, it is assumed that the transmission thyristor Tn of which the number is n is in the ON state. Then, the potential of the gate terminal Gtn is 0V. The gate terminal Gsn of the setting thyristor Sn is connected to the coupling diode Dyn. Accordingly, the potential of the gate terminal Gsn is $-1.5$ V ($-$Vd) due to the pn-junction diffusion potential Vd ($-1.5$ V) and the threshold voltage of the setting thyristor Sn is $-3.0$ V ($-$2Vd).

When the setting thyristor Sn is in the OFF state, the gate terminal Gln of the light-emitting thyristor Ln is connected to the gate terminal Gsn of the setting thyristor Sn via the connecting diode Dzn. Accordingly, the potential of the gate terminal Gln is $-3$V ($-$2Vd) and the threshold voltage of the light-emitting thyristor Ln is $-4.5$ V ($-$3Vd).

The difference (the absolute value) between the threshold voltage of the setting thyristor Sn and the threshold voltage of the light-emitting thyristor Ln is Vd.

When it is intended to drive the light-emitting device 65 by the use of a power source supplying a single potential (single power source), the potential supplied from the signal power source is set to a range in which the setting thyristor Sn is maintained in the ON state and the light-emitting thyristor Ln is maintained in the OFF state. That is, in the diode-coupled light-emitting chip C, the potential of the signal power source is set to the range of $-3$ V ($-$2Vd) to $-4.5$ V ($-$3Vd). The width (the absolute value) of this range is the pn-junction diffusion potential Vd.

On the other hand, the light-emitting device 65 cannot be driven with the potential (the negative potential having the smaller absolute value) higher than $-3$ V (2Vd).

The diffusion potential Vd is determined depending on the semiconductor used and thus cannot be set arbitrarily.

On the contrary, the resistor-coupled light-emitting chip C according to the first exemplary embodiment, the threshold voltage of the setting thyristor Sn is (V($\beta$)$-$Vd) and the threshold voltage of the light-emitting thyristor Ln when the setting thyristor Sn is in the OFF state is (V($\delta$)$-$Vd), as described above. The difference (the absolute value) between the threshold voltages can be made to increase by raising the ratio of (Ru+Rv) to (Rx+Ru+Rv+Rz).

For example, as described above, when Rx=2 k$\Omega$, Ru=8 k$\Omega$, Rv=8 k$\Omega$, and Rz=6 k$\Omega$ and the source potential Vga is $-3.3$ V, the threshold voltage of the setting thyristor Sn is $-1.78$ V and the threshold voltage of the light-emitting thyristor L is $-3.98$ V. The difference (the absolute value) therebetween is 2.2 V which does not limit the diffusion potential Vd. The difference (2.2 V) of the threshold voltage in the resistor-coupled light-emitting chips C is greater than the difference (the diffusion potential Vd (1.5 V)) of the threshold voltage in the diode-coupled light-emitting chips C. Therefore, the resistor-coupled light-emitting chips C according to the first exemplary embodiment have a broad operation margin.

The operating speeds of the setting thyristors S and the light-emitting thyristors L in the light-emitting chip C will be described below. Similarly, "L" of the source potential Vga, the lighting signal $\phi$I, and the setting signal $\phi$W is set to $-3.3$ V.

In the diode-coupled light-emitting chip C, it is assumed that the parasitic capacitance of the $\phi$W terminal is 10 pF and the resistance value of the current-limiting resistor RW is 1 k$\Omega$. Then, when the setting signal $\phi$W is changed from "H" (0 V) to "L" ($-3.3$ V), the time until the potential of the gate terminal Gsn of the setting thyristor Sn is $-3$V which is the threshold voltage is about 24 ns.

When the setting thyristor Sn is turned on but the potential of the gate terminal Gin of the light-emitting thyristor Ln is not $-1.8$ V which is (Vga+Vd), the threshold voltage of the light-emitting thyristor Ln is not "L" ($-3.3$ V) of the lighting signal $\phi$I and thus the light-emitting thyristor Ln is not turned on.

Here, when the combination of the internal resistance of the connecting diode Dzn and the parasitic resistance (mainly based on the contact resistance of the p-type ohmic electrode) of the gate terminal Gin is 2 k$\Omega$ and the parasitic capacitance of the light-emitting thyristor Ln is 3 pF, the time until the potential of the gate terminal Gin of the light-emitting thyristor Ln is $-1.8$ V after the setting thyristor Sn is turned on is about 10 ns.

Therefore, the lighting delay time until the light-emitting thyristor Ln lights after the setting signal $\phi$W is changed from "H" (0 V) to "L" ($-3.3$ V) is about 34 ns which is the sum of two times described above.

Particularly, since the diode-coupled light-emitting chip C is driven with $-3.3$ V close to the upper limit ($-3.0$ V) of the potential of the signal power source, the lighting delay time is great.

When the potential of the signal power source varies by $\pm 0.1$ V, the lighting delay time varies by $\pm 5$ ns.

On the contrary, in the resistor-coupled light-emitting chip C according to the first exemplary embodiment, the time until the potential of the gate terminal Gsn of the setting thyristor Sn reaches $-1.78$ which is the threshold voltage after the setting signal $\phi$W is changed from "H" (0 V) to "L" ($-3.3$ V)

is about 7.8 ns. This is ⅓ of that in the case of the diode-coupled light-emitting chip C. The parasitic capacitance of the φW terminal is 10 pF and the resistance value of the current-limiting resistor RW is 1 kΩ, which are the same as the diode-coupled light-emitting chip C.

When the setting thyristor Sn is turned on, the resistance value (8 kΩ) of the resistor Rv is modulated to the resistor Rv' (0.8 kΩ) of which the resistance value decreases to ⅒ due to the variation in conductivity (conductivity modulation). Then, the potential of the gate terminal Gin is −0.39 V.

When the gate terminal Gln of the light-emitting thyristor Ln with parasitic capacitance of 3 pF is charged with 0.8 kΩ, the time until the potential of the gate terminal Gin of the light-emitting thyristor Ln reaches −1.8 V after the setting thyristor Sn is turned on is about 1 ns.

Therefore, the lighting delay time until the light-emitting thyristor Ln lights after the setting signal φW is changed from "H" (0 V) to "L" (−3.3 V) is about 8.8 ns which is the sum of two times described above. This is ⅓ or less of that (about 34 ns) in the case of the diode-coupled light-emitting chip C.

Even when the potential of the signal power source varies by ±0.1 V, the lighting delay time varies only by ±0.2 ns. This is ¹⁄₂₅ of that (±5 ns)) in the case of the diode-coupled light-emitting chip C.

As described above, since the resistor-coupled light-emitting chip C according to the first exemplary embodiment is smaller in the absolute values of the threshold voltages of the setting thyristors S and the light-emitting thyristors L than the diode-coupled light-emitting chip C, the lighting delay time until the light-emitting thyristors Ln lights after the setting signal φW is changed from "H" (0 V) to "L" (−3.3 V) is shorter and operates at a higher speed, compared with the diode-coupled light-emitting chip C.

Accordingly, by employing the resistor-coupled light-emitting chip C, the writing time to the photosensitive drum 12 by the print head 14 is shortened, compared with the example where the diode-coupled light-emitting chip C is employed. By employing the resistor-coupled light-emitting chip C, it is possible to form an image in the image forming apparatus 1 at a higher speed, compared with the example where the diode-coupled light-emitting chip C is employed.

Second Exemplary Embodiment

A second exemplary embodiment of the invention is different from the first exemplary embodiment, in the configuration of the light-emitting chip C. The other configuration is the same as the first exemplary embodiment. Therefore, the difference from the first exemplary embodiment will be described but the same configuration will not be described.

Figure 11:
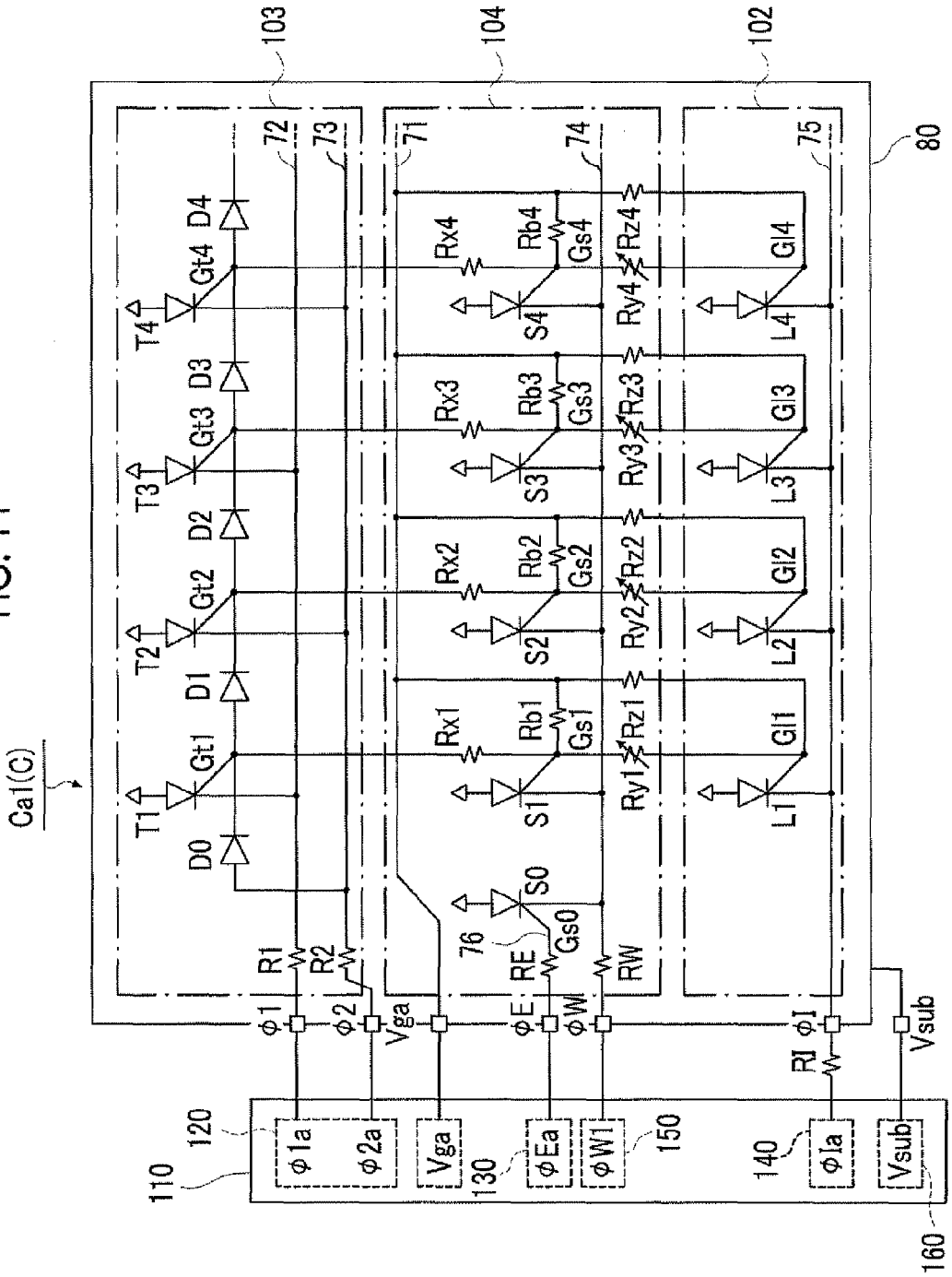
FIG. 11 is an equivalent circuit diagram illustrating the circuit configuration of a light-emitting chip which is a self-scanning light-emitting element array (SLED) chip according to a second exemplary embodiment of the invention.

FIG. 11 is an equivalent circuit diagram illustrating the circuit configuration of a light-emitting chip C which is a self-scanning light-emitting element array (SLED) chip according to the second exemplary embodiment of the invention. Here, the light-emitting chip Ca1 will be described as an example of the light-emitting chip C. Accordingly, the light-emitting chip C is referred to as the light-emitting chip Ca1 (C) in FIG. 11. The configurations of the other light-emitting chips Ca2~Ca20 and Cb1~Cb20 are the same as the light-emitting chip Ca1.

The light-emitting chip Ca1 (C) according to the second exemplary embodiment includes connecting resistors Rb1, Rb2, Rb3, . . . as an example of the fourth connecting resistors, in addition to the light-emitting chip Ca1(C) according to the first exemplary embodiment shown in FIG. 6.

The connecting resistors Rb1, Rb2, Rb3, . . . are disposed between the gate terminals Gs1, Gs2, Gs3, . . . and the power supply line 71, respectively.

Here, when the connecting resistors Rb1, Rb2, Rb3, . . . are not distinguished from each other, they are also referred to as the connecting resistors Rb.

Figure 12:
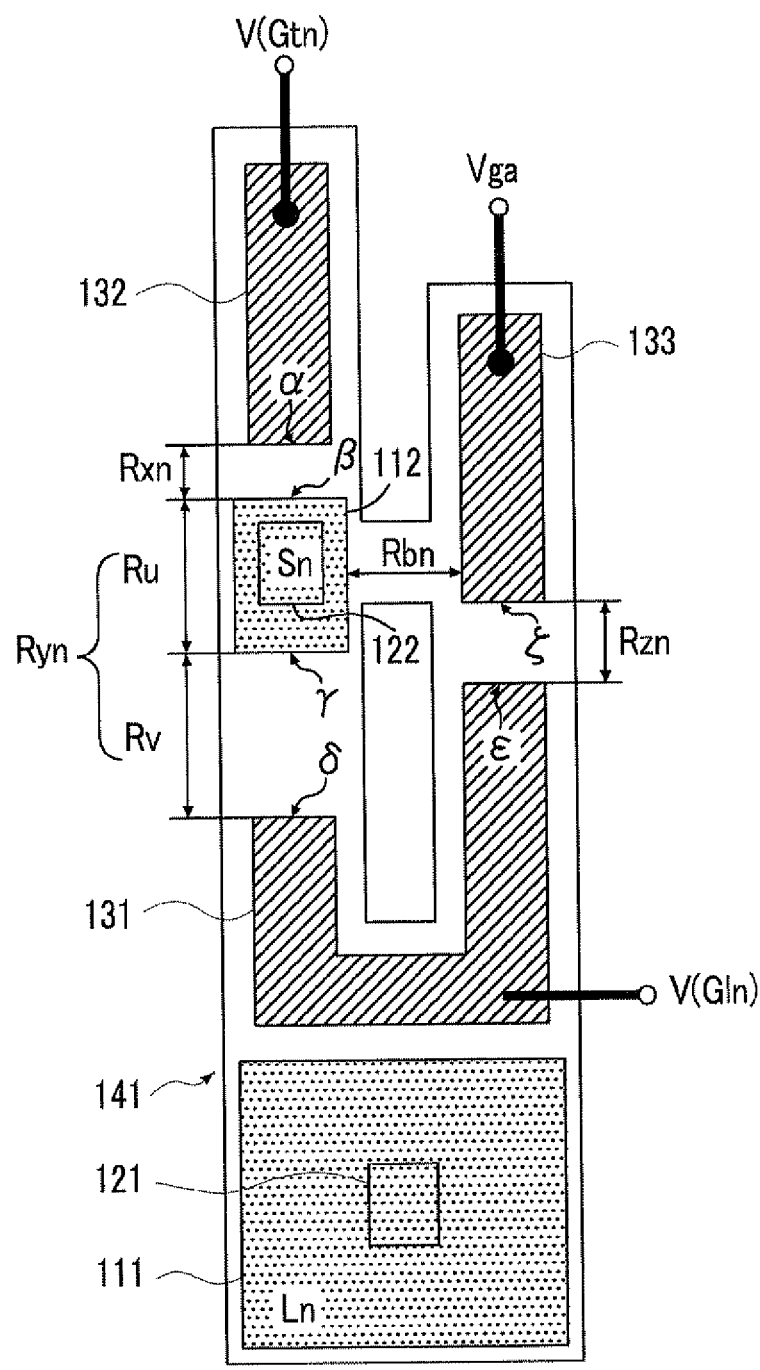
FIG. 12 is an enlarged plan view illustrating a first island in the light-emitting chip according to the second exemplary embodiment.

FIG. 12 is an enlarged plan view of the first island 141 in the light-emitting chip C according to the second exemplary embodiment. The configuration other than the first island 141 and the islands (islands having the light-emitting thyristors L disposed therein) parallel to the first island 141 is the same as the light-emitting chip C according to the first exemplary embodiment shown in FIG. 7. Accordingly, the same configuration will not be described. In FIG. 12, it is assumed that an n-th light-emitting thyristor Ln is formed, similarly to FIG. 7.

The connecting resistor Rb is disposed to connect one branch of the planar U shape to the other branch in the first island 141 in the light-emitting chip C according to the first exemplary embodiment shown in FIG. 7. The connecting resistor Rb has the p-type third semiconductor layer 83 between the p-type ohmic electrode 133 and the setting thyristor Sn as a resistor. In the area of the connecting resistor Rb, the n-type fourth semiconductor layer 84 is removed to expose the p-type third semiconductor layer 83. One terminal of the connecting resistor Rb is the p-type ohmic electrode 133, but the other terminal is not extracted to the outside. The p-type third semiconductor layer 83 constituting the resistor is connected to the gate layer (the p-type third semiconductor layer 83) of the setting thyristor Sn.

The operation of the light-emitting chip C will be described below along with the reason for providing the connecting resistor Rb.

In the first exemplary embodiment, at time h in the timing diagram shown in FIG. 9, the enabling signal φEa transmitted to the light-emitting chip group #a is changed from "L" to "H". Then, the potential of the gate terminal Gs0 of the setting enabling thyristor S0 of the light-emitting chip Ca1 in the light-emitting chip group #a is 0 V and the threshold voltage of the setting enabling thyristor S0 is returned to −1.5 V.

At this time, since the light-emitting thyristor L1 of the light-emitting chip Ca1 is in the ON state and lights (emits light), the potential of the gate terminal Gl1 is 0 V and the potential of the gate terminal Gt1 is 0 V. Accordingly, the potential of the gate terminal Gs1 of the setting thyristor S1 is 0 V and the threshold voltage of the setting thyristor 51 is −1.5 V.

Thereafter, at time k, the setting signal φW1 is changed from "H" to "L" (−3.3 V) so as to turn on the light-emitting thyristor L1 of the light-emitting chip Cb1 of the light-emitting chip group #b. At this time, it is preferable in the light-emitting chip Ca1 that the setting enabling thyristor S0 of which the threshold voltage is −1.5 V is turned on and no setting thyristor S is turned on.

In the light-emitting chip Ca1, the threshold voltage of the setting thyristor S1 is −1.5 V. Accordingly, when the setting signal φW1 is changed from "H" to "L" (−3.3 V), the setting thyristor S1 may be turned on along with the setting enabling thyristor S0 or instead of the setting enabling thyristor S0. Even when the setting thyristor S1 is turned on, the light-emitting thyristor L1 is in the ON state already and thus the state thereof is not changed.

At time 1, when the setting signal φW1 is changed from "L" to "H", the setting thyristor S1 (the setting enabling thyristor S0) in the ON state is turned off.

Here, as indicated by the broken line in FIG. 9, a case where the time in which the setting signal φW1 is changed from "L" (−3.3 V) to "H" is continuous to time q, not time 1, in the period Ta(2) is considered. At time k, it is assumed that the setting thyristor S1 is turned on.

Time q is after the lighting signal φIa is changed from "L" to "H" at time o and then is changed again to "L" at time p. Time q is before the time (without any reference sign) in which the setting signal φW1 is first changed from "H" to "L" in the period Ta(2). Time q may be before or after the enabling signal φEa is changed from "H" to "L" in the period Ta(2).

Then, the setting thyristor S1 turned on at time k is maintained in the ON state up to time q.

At time o, since the lighting signal φIa is changed from "L" to "H", the light-emitting thyristor L1 is turned off and is extinguished. However, since the setting thyristor S1 is in the ON state, the threshold voltage of the light-emitting thyristor L1 is −1.89 V. Accordingly, when the lighting signal φIa is changed again from "H" to "L" at time p, the light-emitting thyristor L1 is turned on again and lights (emits light).

The lighting (the emitting of light) of the light-emitting thyristor L1 at time p is erroneous, which is not desirable.

At time q, even when the enabling signal φEa is "H" or "L", only the threshold voltage of the setting enabling thyristor S0 varies and the setting thyristor S1 is maintained in the ON state.

To suppress the erroneous emission of light, as described in the first exemplary embodiment, the time (time 1 in FIG. 9) of changing the setting signal φW1 from "L" to "H" can be set to be before time p of changing the lighting signal φIa again from "H" to "L".

On the other hand, at time k, the setting thyristor S1 may not be turned on. In this case, even when the time of changing the setting signal φW1 from "L" to "H" may be set to be after time p of changing the lighting signal φIa again from "H" to "L" (time q in FIG. 9), it is possible to suppress the erroneous lighting of the light-emitting thyristor L1.

For this purpose, the threshold voltage of the setting thyristor S1 can be set to be lower (to have a negative value of which the absolute value is greater) than the threshold voltage of the setting enabling thyristor S0.

In the light-emitting chip C according to the second exemplary embodiment, the threshold voltage of the setting thyristor S1 is set to be lower (to have a negative value of which the absolute value is greater) than the threshold voltage of the setting enabling thyristor S0 by disposing the connecting resistor Rb.

The above-mentioned erroneous emission of light occurs when the light-emitting thyristor L1 is in the ON state at time k of changing the setting signal φW1 from "L" to "H". The erroneous emission of light does not occur when the light-emitting thyristor L1 is in the OFF state. That is, when the light-emitting thyristor L1 is in the OFF state, the threshold voltage of the setting thyristor S1 is −1.78 V and the threshold voltage of the setting enabling thyristor S0 is lower than −1.5 V. Accordingly, the setting enabling thyristor S0 is earlier turned on than the setting thyristor S1 to set the setting signal line 74 to −1.5 V. Accordingly, the setting thyristor S1 is not turned on.

Here, the threshold voltage of the setting thyristor S will be described in detail. It is assumed that the transmission thyristor Tn and the light-emitting thyristor Ln of which the number is n are both in the ON state.

Similarly to the first exemplary embodiment, Rx=2 kΩ, Ru=8 kΩ, Rv=8 kΩ, Rz=6 kΩ, Vga=−3.3 V, and Rb=2 kΩ are set.

Since the transmission thyristor Tn is in the ON state, the potential V(Gtn) of the gate terminal Gtn is 0 V. Since the light-emitting thyristor Ln is also in the ON state, the potential V(Gln) of the gate terminal Gln is also 0 V.

Then, the potential of the edge (β) is −0.66 V. In the setting thyristor Sn, since the potential of the edge (β) is the highest (a negative value having the smallest absolute value), the threshold voltage of the setting thyristor Sn is −2.16 V. The threshold voltage is lower than the threshold voltage (−1.5 V) of the setting enabling thyristor S0. Accordingly, when the setting signal φW is changed from "L" to "H", the setting enabling thyristor S0 of which the threshold voltage is higher than that of the setting thyristor Sn is earlier turned on to set the setting signal line 74 to −1.5 V. Accordingly, it is possible to suppress the setting thyristor Sn from being turned on.

In the first exemplary embodiment and the second exemplary embodiment, the resistance values of the connecting resistors Rx, the connecting resistors Ry (the resistors Ru, Rv, and Rv'), the connecting resistors Rz, the connecting resistors Rb (only the second exemplary embodiment) are set and stated. The resistance values are only an example but other resistance values may be used.

In the first exemplary embodiment and the second exemplary embodiment, the light-emitting chip C includes the setting enabling thyristor S0, but may not include the setting enabling thyristor.

In the first exemplary embodiment and the second exemplary embodiment, the transmission thyristors T are driven with two phases of the first transmission signal φ1 and the second transmission signal φ2, but three transmission thyristors T may be supplied and driven with three-phase transmission signals. Similarly, transmission signals of four or more phases may be supplied for driving.

In the first exemplary embodiment and the second exemplary embodiment, the coupling diodes D are used as the electrical elements, but the invention is not limited to the diodes. As long as it causes a variation in potential of one terminal to affect a variation in potential of the other terminal, the electrical element may be a resistor.

In the first exemplary embodiment and the second exemplary embodiment, the light-emitting chip C is mounted with a single self-scanning light-emitting element array (SLED), but two or more SLEDs may be mounted thereon.

In the first exemplary embodiment and the second exemplary embodiment, the number of light-emitting chip groups is two, but may be three or more.

The number of light-emitting chips C constituting the light-emitting chip group and the number of light-emitting chips C constituting the light-emitting chip set are equal to each other, but may be different from each other. The light-emitting chips C constituting the light-emitting chip set belong to different light-emitting groups, but the light-emitting chip set may include the light-emitting chips C belonging to the same light-emitting chip group.

In the first exemplary embodiment and the second exemplary embodiment, the thyristors (the transmission thyristors T, the setting thyristors S, the setting enabling thyristor S0, and the light-emitting thyristors L) have an anode-common structure in which the anode terminal is common. A cathode-common structure in which the cathode terminal is common may be used by changing the polarity of the circuit.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting chip comprising:
a plurality of light-emitting thyristors that are disposed on a substrate and each of which has a first anode terminal, a first cathode terminal, and a first gate terminal;
a plurality of setting thyristors that are disposed on the substrate to correspond to the plurality of light-emitting thyristors, each of which has a second anode terminal, a second cathode terminal, and a second gate terminal, and each of which is switched to an ON state to set the absolute value of a threshold voltage of the corresponding light-emitting thyristor to be smaller than that in an OFF state;
a plurality of transmission thyristors that are disposed on the substrate to correspond to the plurality of setting thyristors, each of which has a third anode terminal, a third cathode terminal, and a third gate terminal, and each of which is sequentially switched to an ON state to set the absolute value of a threshold voltage of the corresponding setting thyristor to be smaller than that in an OFF state;
a plurality of first connecting resistors that are disposed on the substrate and that connect the first gate terminals of the plurality of light-emitting thyristors and the second gate terminals of the plurality of setting thyristors to each other such that the light-emitting thyristors and the setting thyristors correspond with each other;
a plurality of second connecting resistors that are disposed on the substrate and that connect the second gate terminals of the plurality of setting thyristors and the third gate terminals of the plurality of transmission thyristors to each other such that the setting thyristors and the transmission thyristors correspond with each other; and
a plurality of third connecting resistors that are disposed on the substrate and that connect the first gate terminals of the plurality of light-emitting thyristors to a power supply line supplied with a source potential for supplying drive power.

2. The light-emitting chip according to claim 1, further comprising:
a setting terminal that is connected to one of the second anode terminal and the second cathode terminal of each of the plurality of setting thyristors and that is supplied with a setting signal for switching the setting thyristors, of which the threshold voltage is set to be smaller by the corresponding transmission thyristors in the ON state, to the ON state.

3. The light-emitting chip according to claim 2, further comprising:
a setting enabling thyristor that has a fourth anode terminal, a fourth cathode terminal, and a fourth gate terminal and of which one of the fourth anode terminal and the fourth cathode terminal is connected to the setting terminal; and
an enabling terminal that is connected to the fourth gate terminal of the setting enabling thyristors and that is supplied with an enabling signal for setting the absolute value of the threshold voltage of the setting enabling thyristors to be smaller so as to prevent the light-emitting thyristors from newly emitting light in response to the setting signal.

4. The light-emitting chip according to claim 1, wherein when the setting thyristor connected to each of the plurality of first connecting resistors is switched to the ON state, a resistance value of each first connecting resistor becomes smaller than that when the corresponding setting thyristor is in the OFF state.

5. The light-emitting chip according to claim 2, wherein when the setting thyristor connected to each of the plurality of first connecting resistors is switched to the ON state, a resistance value of each first connecting resistor becomes smaller than that when the corresponding setting thyristor is in the OFF state.

6. The light-emitting chip according to claim 3, wherein when the setting thyristor connected to each of the plurality of first connecting resistors is switched to the ON state, a resistance value of each first connecting resistor becomes smaller than that when the corresponding setting thyristor is in the OFF state.

7. The light-emitting chip according to claim 1, further comprising:
a plurality of fourth connecting resistors that connect the second gate terminals of the plurality of setting thyristors to the power supply line, respectively.

8. The light-emitting chip according to claim 2, further comprising:
a plurality of fourth connecting resistors that connect the second gate terminals of the plurality of setting thyristors to the power supply line, respectively.

9. The light-emitting chip according to claim 3, further comprising:
a plurality of fourth connecting resistors that connect the second gate terminals of the plurality of setting thyristors to the power supply line, respectively.

10. The light-emitting chip according to claim 4, further comprising:
a plurality of fourth connecting resistors that connect the second gate terminals of the plurality of setting thyristors to the power supply line, respectively.

11. The light-emitting chip according to claim 5, further comprising:
a plurality of fourth connecting resistors that connect the second gate terminals of the plurality of setting thyristors to the power supply line, respectively.

12. The light-emitting chip according to claim 6, further comprising:
a plurality of fourth connecting resistors that connect the second gate terminals of the plurality of setting thyristors to the power supply line, respectively.

13. A print head comprising:
an exposing unit that includes a plurality of light-emitting chips and that exposes an image-holding member to form an electrostatic latent image; and
an optical unit that focuses light applied from the exposing unit on the image-holding member,
wherein each light-emitting chip includes
a plurality of light-emitting thyristors that are disposed on a substrate and each of which has a first anode terminal, a first cathode terminal, and a first gate terminal,
a plurality of setting thyristors that are disposed on the substrate to correspond to the plurality of light-emitting thyristors, each of which has a second anode terminal, a second cathode terminal, and a second gate terminal, and each of which is switched to an ON state to set the absolute value of a threshold voltage of the corresponding light-emitting thyristor to be smaller than that in an OFF state,
a plurality of transmission thyristors that are disposed on the substrate to correspond to the plurality of setting thyristors, each of which has a third anode terminal, a third cathode terminal, and a third gate terminal, and each of which is sequentially switched to an ON state to set the absolute value of a threshold voltage of the corresponding setting thyristor to be smaller than that in an OFF state, a plurality of first connecting resistors that are disposed on the substrate and that connect the first gate terminals of the plurality of light-emitting thyristors and the second gate terminals of the plurality of setting thyristors to each other such that the light-emitting thyristors and the setting thyristors correspond with each other, a plurality of second connecting resistors that are disposed on the substrate and that connect the second gate terminals of the plurality of setting thyristors and the third gate terminals of the plurality of transmission thyristors to each other such that the setting thyristors and the transmission thyristors correspond with each other, and a plurality of third connecting resistors that are disposed on the substrate and that connect the first gate terminals of the plurality of light-emitting thyristors to a power supply line supplied with a source potential for supplying drive power.

14. An image forming apparatus comprising:

an image-holding member;

a charging unit that charges the image-holding member;

an exposing unit that includes a plurality of light-emitting chips and that exposes the image-holding member to form an electrostatic latent image;

an optical unit that focuses light applied from the exposing unit on the image-holding member;

a developing unit that develops the electrostatic latent image formed on the image-holding member; and a transfer unit that transfers the developed image on the image-holding member to a transferring medium, wherein each light-emitting chip includes a plurality of light-emitting thyristors that are disposed on a substrate and each of which has a first anode terminal, a first cathode terminal, and a first gate terminal, a plurality of setting thyristors that are disposed on the substrate to correspond to the plurality of light-emitting thyristors, each of which has a second anode terminal, a second cathode terminal, and a second gate terminal, and each of which is switched to an ON state to set the absolute value of a threshold voltage of the corresponding light-emitting thyristor to be smaller than that in an OFF state, a plurality of transmission thyristors that are disposed on the substrate to correspond to the plurality of setting thyristors, each of which has a third anode terminal, a third cathode terminal, and a third gate terminal, and each of which is sequentially switched to an ON state to set the absolute value of a threshold voltage of the corresponding setting thyristor to be smaller than that in an OFF state, a plurality of first connecting resistors that are disposed on the substrate and that connect the first gate terminals of the plurality of light-emitting thyristors and the second gate terminals of the plurality of setting thyristors to each other such that the light-emitting thyristors and the setting thyristors correspond with each other, a plurality of second connecting resistors that are disposed on the substrate and that connect the second gate terminals of the plurality of setting thyristors and the third gate terminals of the plurality of transmission thyristors to each other such that the setting thyristors and the transmission thyristors correspond with each other, and a plurality of third connecting resistors that are disposed on the substrate and that connect the first gate terminals of the plurality of light-emitting thyristors to a power supply line supplied with a source potential for supplying drive power.

* * * * *